US00RE47038E

(19) United States
(12) Reissued Patent
Pearce

(10) Patent Number: US RE47,038 E
(45) Date of Reissued Patent: Sep. 11, 2018

(54) MULTICHANNEL POWER AMPLIFYING

(71) Applicant: Bose Corporation, Framingham, MA (US)

(72) Inventor: Daniel Scott Pearce, Worcester, MA (US)

(73) Assignee: Bose Corporation, Framingham, MA (US)

(21) Appl. No.: 15/176,359

(22) Filed: Jun. 8, 2016

Related U.S. Patent Documents

Reissue of:
(64) Patent No.: 6,771,123
Issued: Aug. 3, 2004
Appl. No.: 10/126,020
Filed: Apr. 19, 2002

(51) Int. Cl.
*H03F 3/68* (2006.01)

(52) U.S. Cl.
CPC ..... *H03F 3/68* (2013.01)

(58) Field of Classification Search
CPC ..... H03F 3/68
USPC ..... 330/124 R, 207 A, 251, 295
See application file for complete search history.

(56) References Cited

U.S. PATENT DOCUMENTS 4,481,660 A * 11/1984 de Koning et al. ..... 330/124 R
4,683,591 A 7/1987 Dawson et al.
5,093,668 A * 3/1992 Sreenivas ..... 342/374
5,200,708 A * 4/1993 Morris et al. ..... 330/124 R
5,675,285 A * 10/1997 Winters ..... 330/124 R
5,834,972 A * 11/1998 Schiemenz, Jr. ..... H03F 3/602 330/124 D
6,069,525 A 5/2000 Sevic et al.
6,181,796 B1 * 1/2001 Johnson ..... 330/124 R
6,529,073 B1 * 3/2003 Highfill, III et al. ..... 330/207 P

FOREIGN PATENT DOCUMENTS

EP 0565053 A1 10/1993
JP S59-107699 A 6/1984
JP S63-36200 A 7/1988
JP H02-214335 A 8/1990
(Continued)

OTHER PUBLICATIONS

European Search Report for Application No. 03100803.0-2202 dated Aug. 25, 2005.
(Continued)

*Primary Examiner* — My-Trang Ton
(74) *Attorney, Agent, or Firm* — Brian M. Dingman; Dingman IP Law, PC

(57) ABSTRACT

A multichannel electrical power amplifying system constructed and arranged to distribute electrical power of amount P to a total load coupled thereto. The system includes a plurality n of power amplifier channels, coupling the power amplifying system to a portion of the electrical load. Each of the amplifier channels distributes a portion of the electrical power P to a portion of the electrical load. Each power amplifier channel has a power distribution capacity, at least one of the power amplifier channels having a power distribution capacity significantly greater than $$\frac{P}{n}.$$

The sum of the capacities of the plurality of amplifier channels is significantly greater than P.

11 Claims, 32 Drawing Sheets

(56) References Cited

FOREIGN PATENT DOCUMENTS

| | | | |
|---|---|---|---|
| JP | H03-172100 | A | 7/1991 |
| JP | H03-201710 | A | 9/1991 |
| JP | H0457911 | A | 5/1992 |
| JP | H07-111698 | A | 4/1995 |
| JP | H08181553 | A | 7/1996 |
| JP | H10-302597 | A | 11/1998 |
| JP | H10-322149 | A | 12/1998 |
| JP | H11-177359 | A | 7/1999 |
| JP | 2001-128298 | A | 5/2001 |
| JP | 2002111399 | A | 4/2002 |
| WO | 9837627 | A1 | 8/1998 |

OTHER PUBLICATIONS

Japanese Office Action dated Nov. 4, 2008 for Japanese Patent Applicaton No. 2003-115466.
Japanese Office Action dated Sep. 8, 2009 for Japanese Patent Applicaton No. 2003-115466.

* cited by examiner

NOTE: Q19 - Q22 = STW18NB40
+130/170
-130/170
R2
010 1W
C12
0.1 200V
C1
47uF 200V
D1
UF1G
Q1
62
C8
0.1 200V
L1
33uH
PWM-Ch1
OUT-Ch1
Output
SK1
Ch1+
Ch1-
D5
B160B
R5
33 1W
R15
499K
39.2K 1W
C20
R19
47pF C0G
(50V)
D2
UF1G
64
Q2
D6
B160B
R6
33 1W
R17
100K
0.1 200V
C10
0.1 400V
C7
0.1 400V
C4
R25
R26
68 5W x 2
R1
.010 1W
C13
C2
47uF 200V
0.1 200V
52
100-200V 2.5A
PS1
PL1
PL2
0.1 200V
C17
C16
0.1 200V
PS2
58
PS3
12V 500mA
100-200V 2.5A
54
VN12
J
K
L
+130/170
C14
0.1 200V
60
PS4
5V 200mA
R4
.010 1W
PL3
PL4
66
D3
UF1G
D7
B160B
R16
499K
Q3
C9
0.1 200V
R7
33 1W
L2
33uH
PWM-Ch2
OUT-Ch2
Output
SK2
Ch2+
Ch2-
0.1 400V
C6
C5
0.1 400V
R8
33 1W
D4
UF1G
68
Q4
D8
B160B
R18
100K
0.1 200V
C11
R27
R28
68 5W x 2
R3
.010 1W
C15
C3
47uF 200V
0.1 200V
A
B
C
D
E
F
G
H
I
M
N
O
P
Q
R
S
T
U

```
Generic Parts Used:
*******************
Generic Diode-SMT = #257662 (1N4148W)
133625-NNNZ  125mW   RC0805    1% MF 150V
133626-NNZT  100mW   RC0805 2+5% CF 100V
187607-NNZT   1/4W   RC1210 2-5% CF 200V
187607-NNZT   1/4W   RC1210 2-5% CF 200V
181895-NNNZ     1W   RC2512    5% CF 200V

NEW PART #s CREATED:
********************
R's:
260699-NNZT mOhm 1W  RC2512 .5-5% MF 200V
260XXX-NNNZ  1W  RC2512  1% MF 200V

CAPS:
260696-NNZT(pF) 200V+ RC1210  X7R T: K=10%
260694-NNZV(µF) GP SMT 20% 'Lytic, NON-POLAR
260693-NNZV(µF) 4-pin SnapIn 'Lytic,85^C 20%
260691-NNZ (µF) Radial 'Lytic, 200V,85^C 20%
```

NOTES

1. Unless otherwise marked: Capacitors in µF
   Resistors; 2 sign. fig's = 1 / 10W 5% C.F. 0805
   3 sign. fig's = 1 / 10W 1% C.F. 0805

Diodes are 1N4148W, except * = 1N4004W

2. Ports: On this Sheet: Port Name <Location>
   On Other Sheet: Port Name <Page, Location>

3. * denotes part mounted on main heatsink.

NOTES

1. Unless otherwise marked: Capacitors in µF
   Resistors; 2 sign. fig's = 1 / 10W 5% C.F. 0805
   3 sign. fig's = 1 / 10W 1% C.F. 0805

Diodes are 1N4148W, except * = 1N4004W

2. Ports: On this Sheet: Port Name <Location>
   On Other Sheet: Port Name <Page, Location>

3. * denotes part mounted on main heatsink.

MULTICHANNEL POWER AMPLIFYING

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

The invention relates to power amplifiers, and more particularly to multichannel power amplifiers. The power distribution capacities of multichannel amplifiers are typically "rated," on a "per channel" basis, usually on an "all channels driven" basis; that is, each of the four channels has a power distribution capacity of the per channel rating when all the channels are driving an electrical load. The total power distribution capacity of the amplifier system (often unspecified in a conventional multichannel amplifier) is the sum of the "per channel" ratings. For example, a four channel amplifier may be rated as 100 watts per channel, that is, each channel has a power distribution capacity of 100 watts, and the total rating, or power distribution capacity of the multichannel amplifier is 400 watts. To use all 400 watts of power distribution capacity, each channel would have a total load of 100 watts, but no more.

It is an important object of the invention to provide an improved multichannel power amplifier.

BRIEF SUMMARY OF THE INVENTION

According to the invention, a multichannel electrical power amplifying system is constructed and arranged to distribute electrical power of amount P to an electrical load coupled thereto. The system includes a plurality n of power amplifier channels, coupling the power amplifying system to a portion of the electrical load, each of the amplifier channels for distributing a portion of the electrical power P to a portion of the electrical load. Each power amplifier channel has a power distribution capacity, and at least one of the power amplifier channels is constructed and arranged to have a power distribution capacity significantly greater than $$\frac{P}{n}$$

and the sum of the capacities of the plurality of amplifier channels is significantly greater than P.

In another aspect of the invention, a multichannel electrical power amplifying system is constructed and arranged to provide a total amount of electrical power P. The amplifying system includes a plurality of electrically powered devices, the plurality of devices representing an electrical load. The amplifying system also includes a number n of power amplifier channels, each amplifier channel coupled to a portion of the electrical load, each of the plurality of power amplifier channels for providing a portion of the total amount of electrical power P to the portion of the electrical load. One of the portions significantly exceeds $$\frac{P}{n}.$$

The amplifying system also includes a plurality of input channels for receiving a plurality of input signals and circuitry to selectively route the input signal from any of the plurality of input channels to any one of the power amplifier channels.

Other features, objects, and advantages will become apparent from the following detailed description, which refers to the following drawing in which:

DETAILED DESCRIPTION

Figure 1:
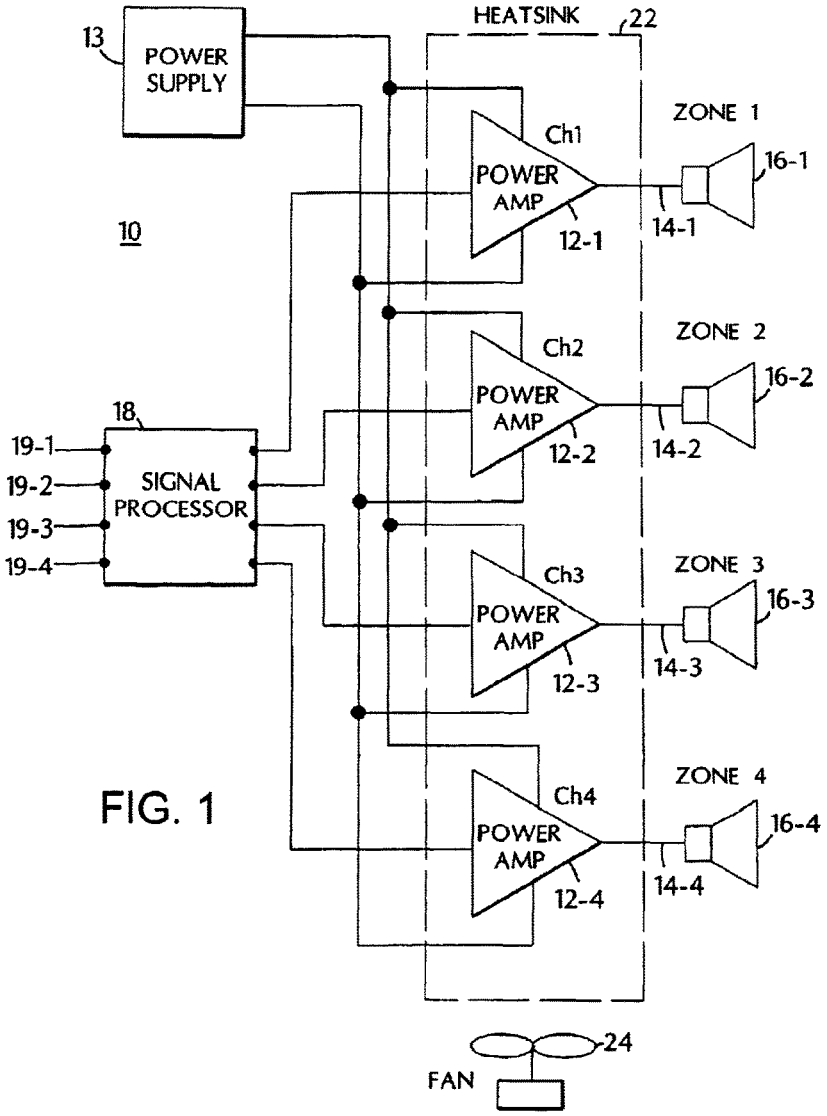
FIG. 1 is a block diagram of a four channel power amplifying system according to the invention.

With reference now to the drawing and more particularly to FIG. 1, there is shown a block diagram of an audio signal power amplifier system incorporating the invention. A multichannel power amplifier system 10 includes a common power supply 13 (that is, a power supply that powers all channels of the power amplifier system) coupled to four high voltage, low current power amplifiers 12-1-12-4 (hereinafter power amplifiers, and sometimes referred to as constant voltage, distributed amplifiers) which are coupled to four audio output lines 14-1-14-4. Each of the audio output lines 14-1-14-4 has audio devices 16-1-16-4 coupled to it. Audio signal processor and router 18 has a plurality of input terminals 19-1-19-4 and a plurality of multiple output terminals 20-1-20-4. Each of the output terminals 20-1-20-4 is coupled to one of the power amplifiers 12-1-12-4. The power amplifiers 12-1-12-4 are mounted on a single heatsink 22. Optional fan 24, if necessary, is positioned so that it directs a cooling airflow across heatsink 22.

In operation, audio signals are received at input terminals 19-1-19-4 and routed to output terminals 20-1-20-4 and conducted to any one of power amplifiers 12-1-12-4, which amplify the audio signals and transmit them to electrical loads 16-1-16-4, typically electroacoustic transducers, which transduce the amplified audio signals to sound waves. Power supply 13 converts line AC voltage current to a DC voltage suitable for powering 70.7- or 100-volt low-current direct-drive power amplifiers; typically ±130 or ±170 volts, respectively, is suitable. The output of power supply 13 is conducted to power amplifiers 12-1-12-4. Heatsink 22 conducts heat away from power amplifiers 12-1-12-4. If passive cooling is insufficient to conduct the heat away from the heat sink, optional fan 24 directs heat away from heatsink 22 to the external environment.

Figures 1, 5A:
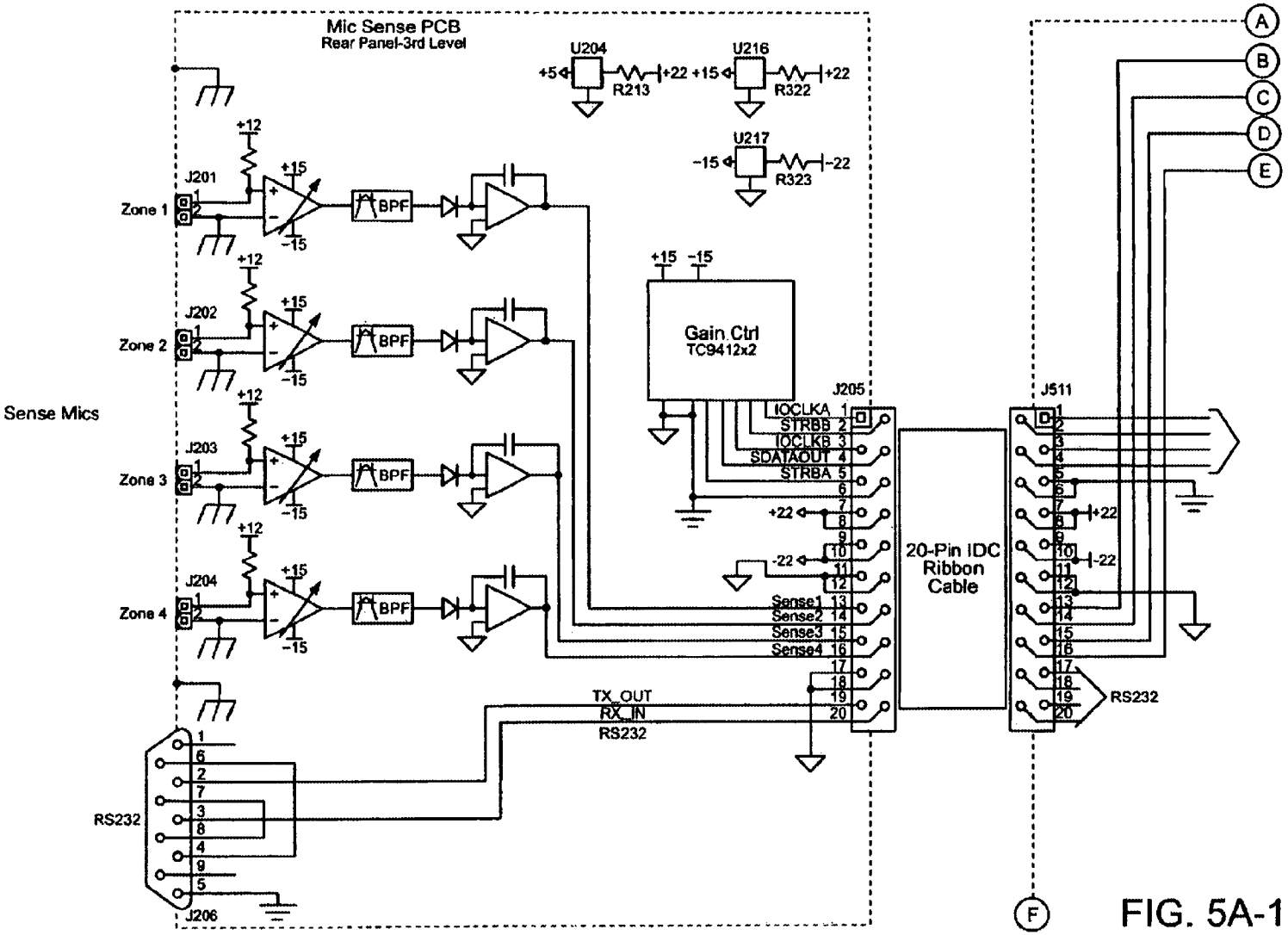
FIGS. 5A-5D are four schematic diagrams, which, combined show a circuit of a power amplifying system as in FIG. 1.
Figures 2, 5A:
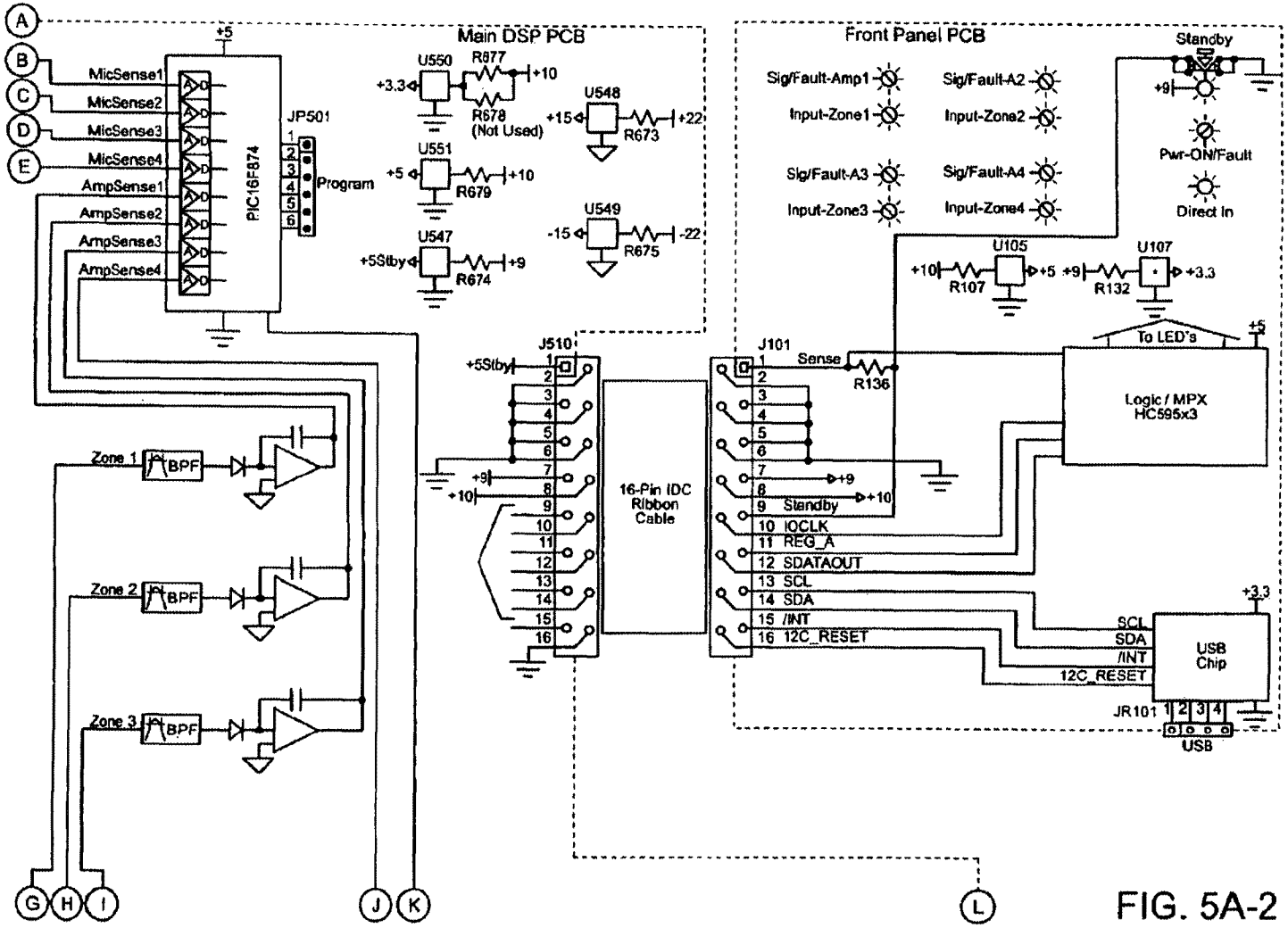
Figures 3, 5A:
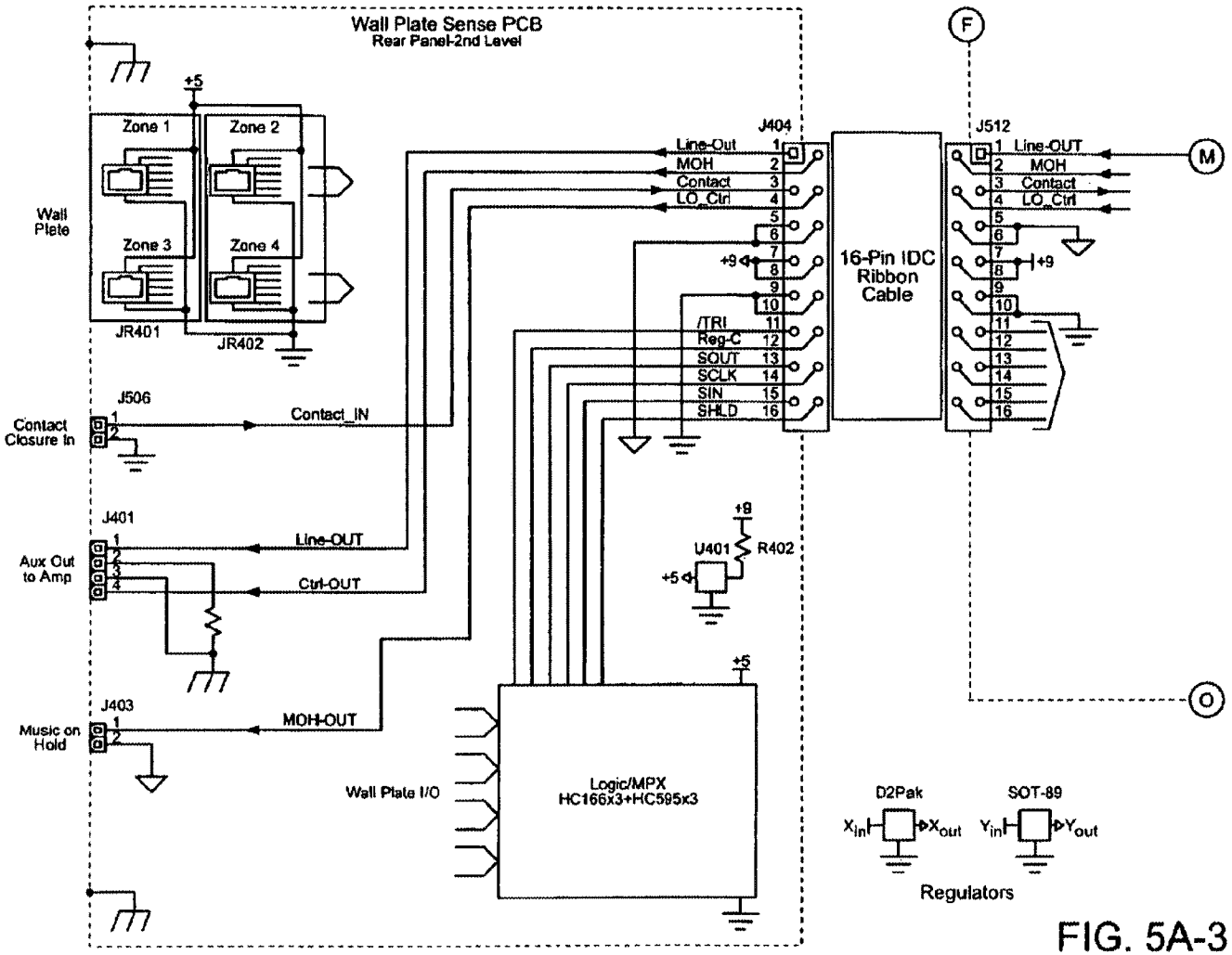
Figures 4, 5A:
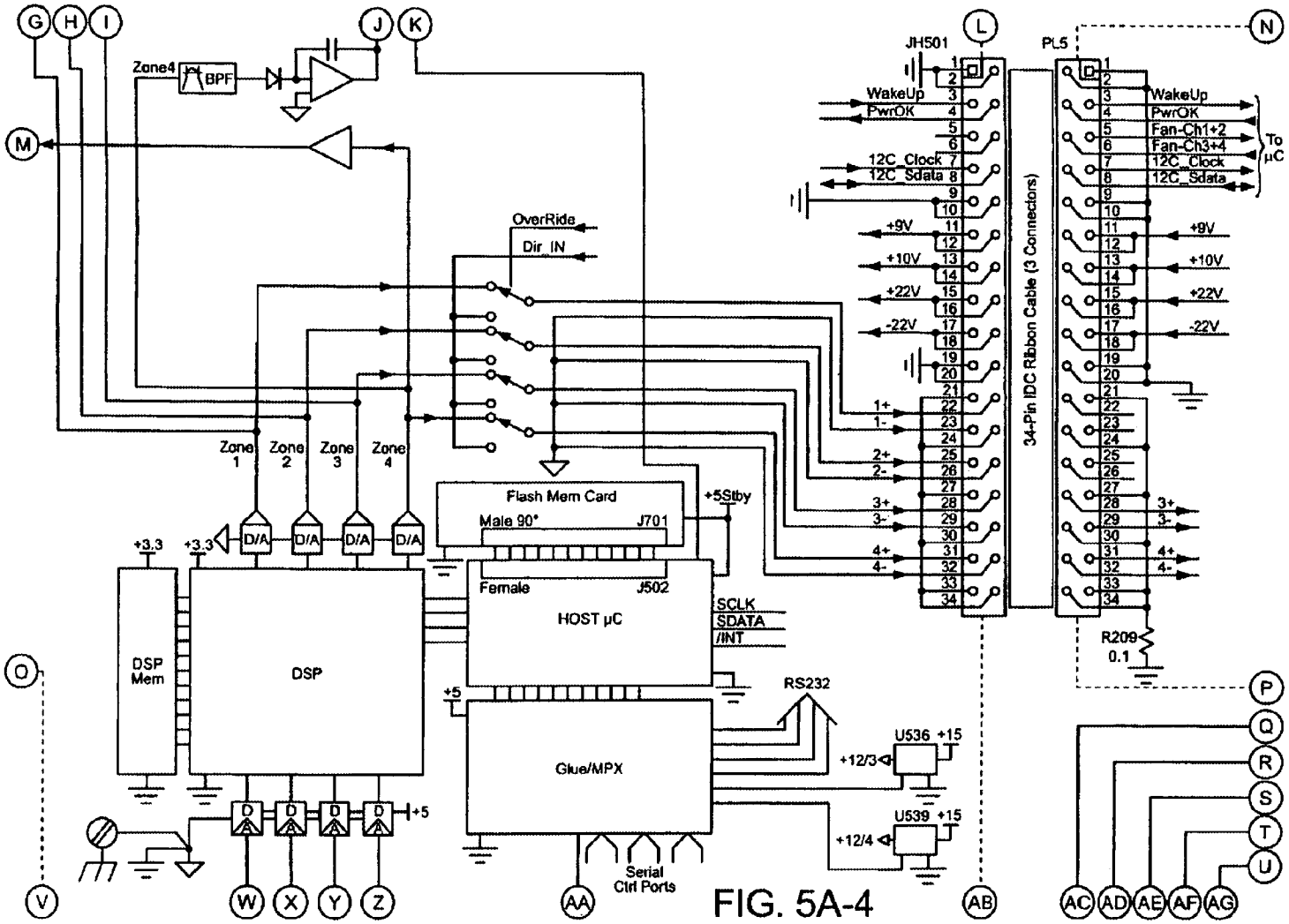
Figures 5, 5A:
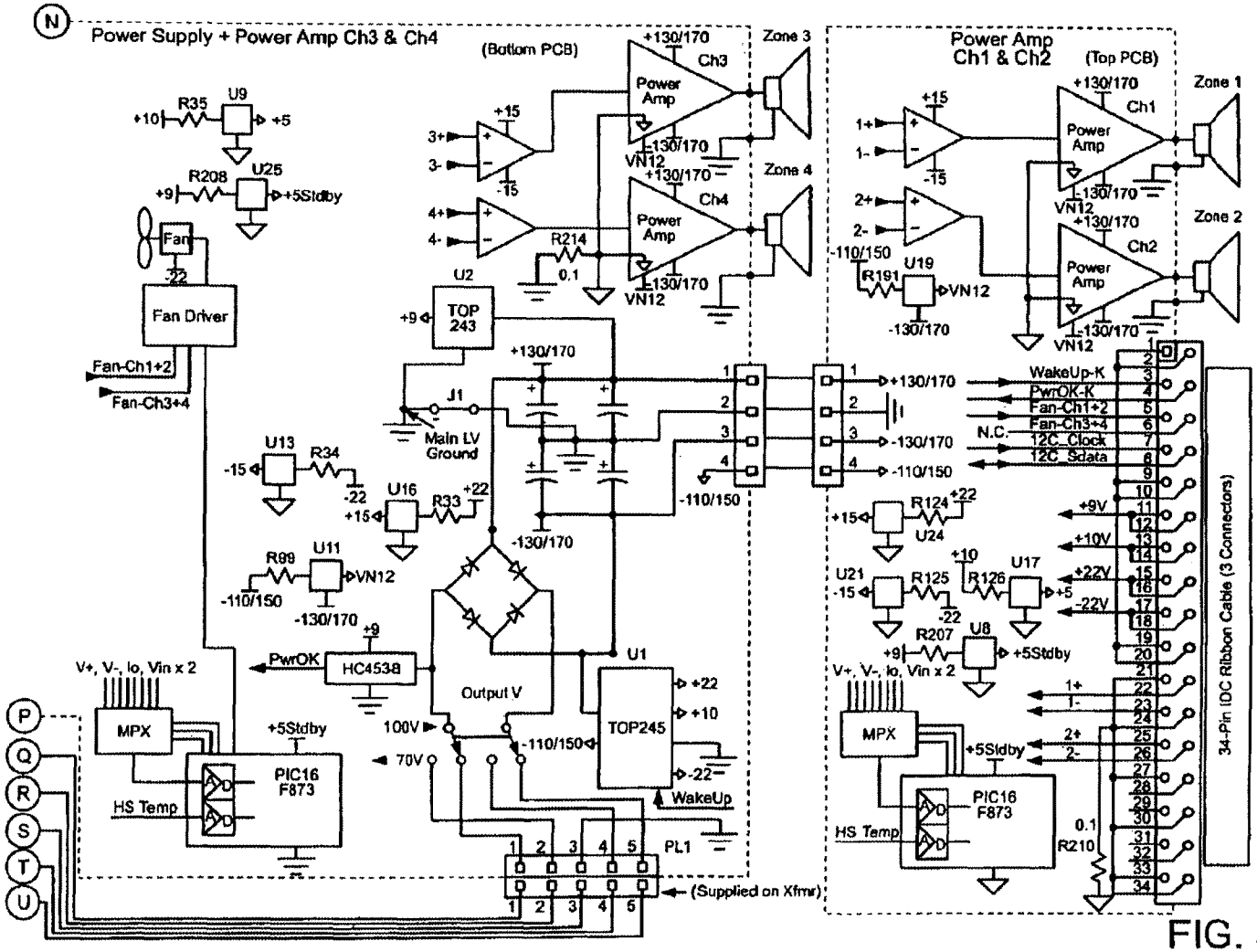
Figures 5, 5A, 6:
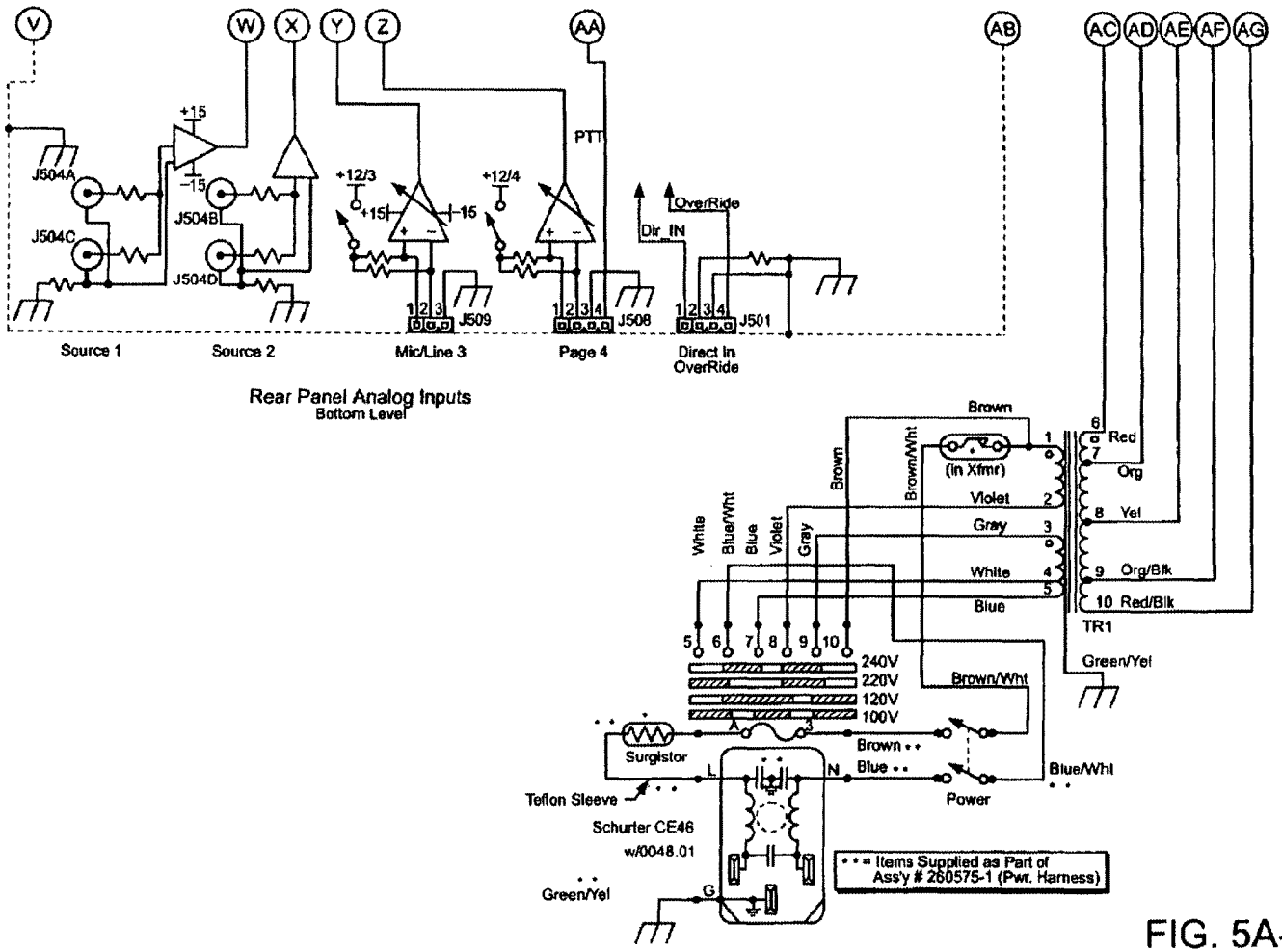
Figures 1, 5B:
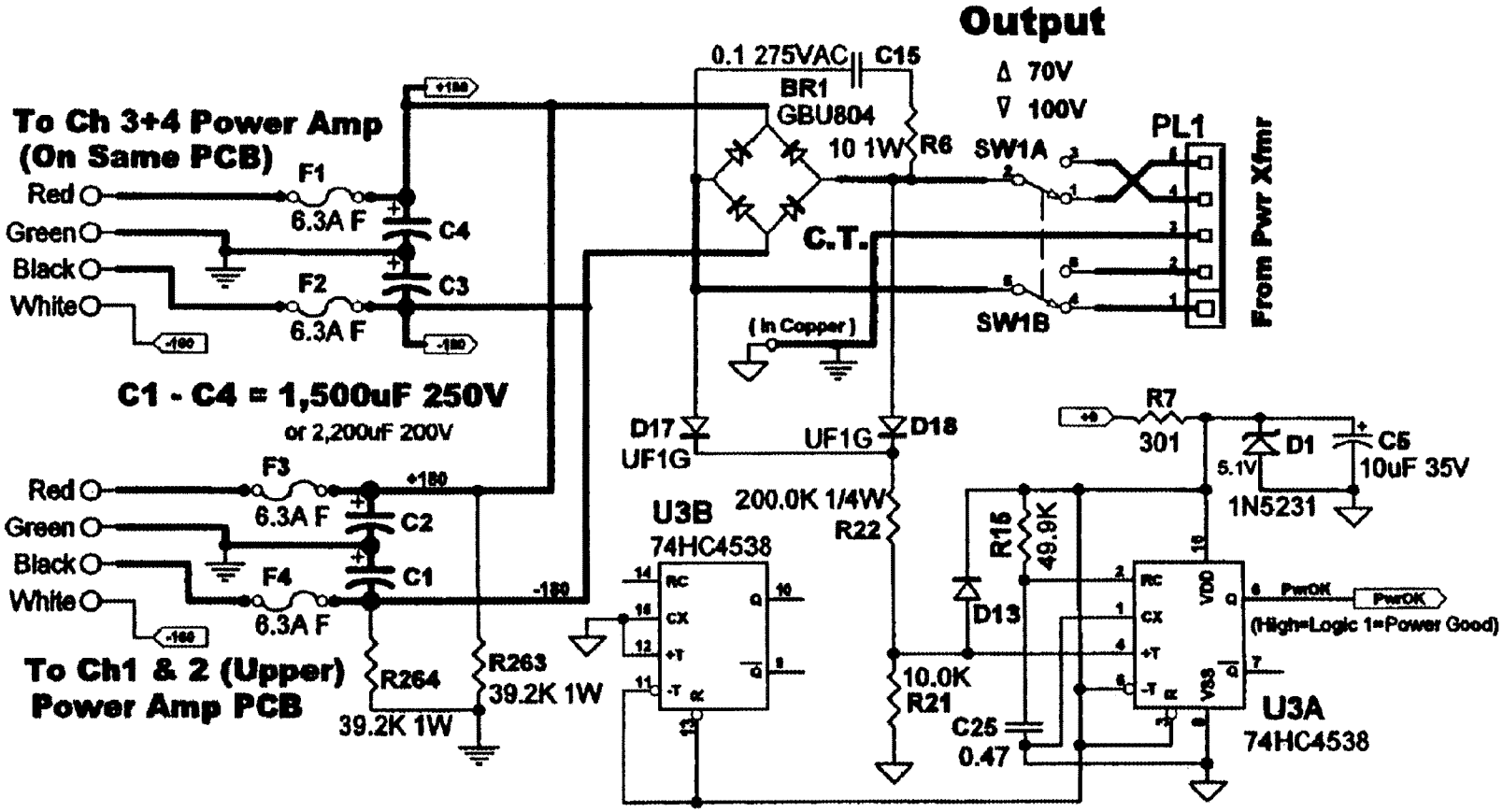
Figures 2, 5B:
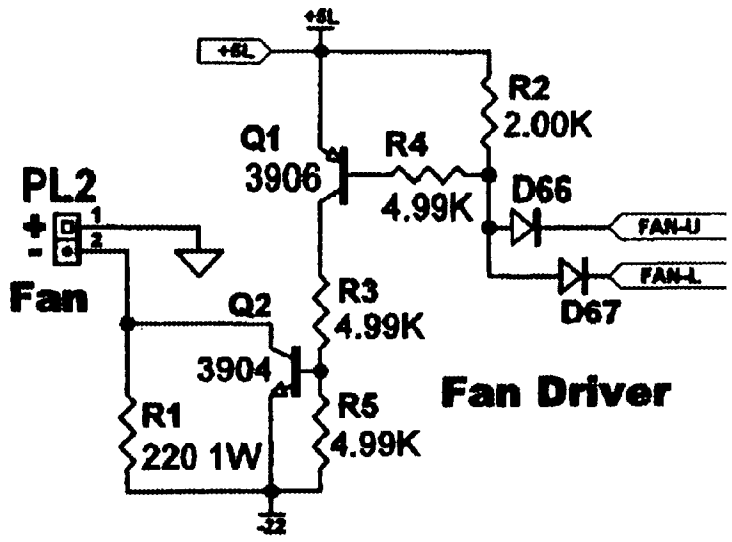
Figures 3, 5B:
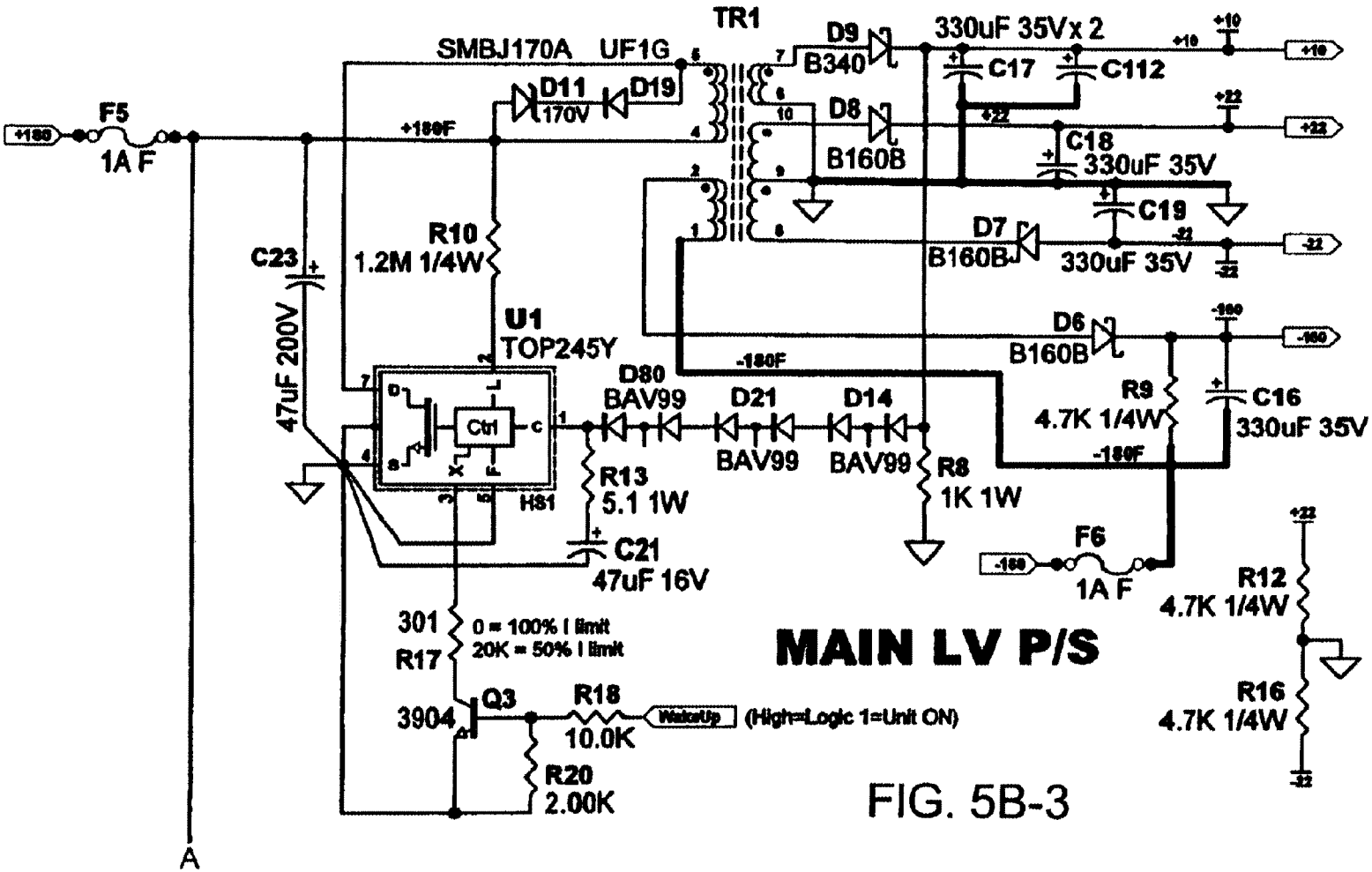
Figures 4, 5B:
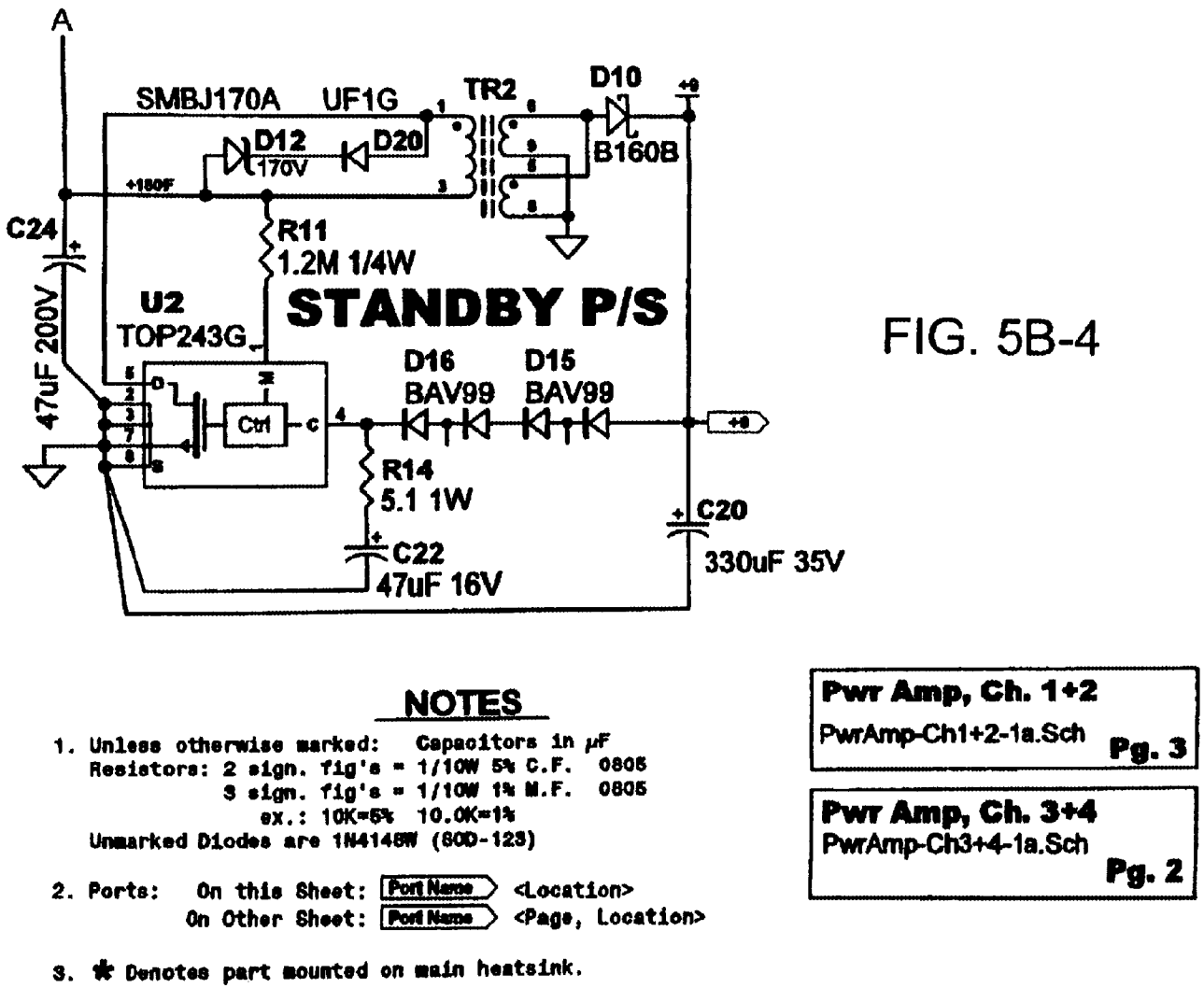
Figures 1, 5C:
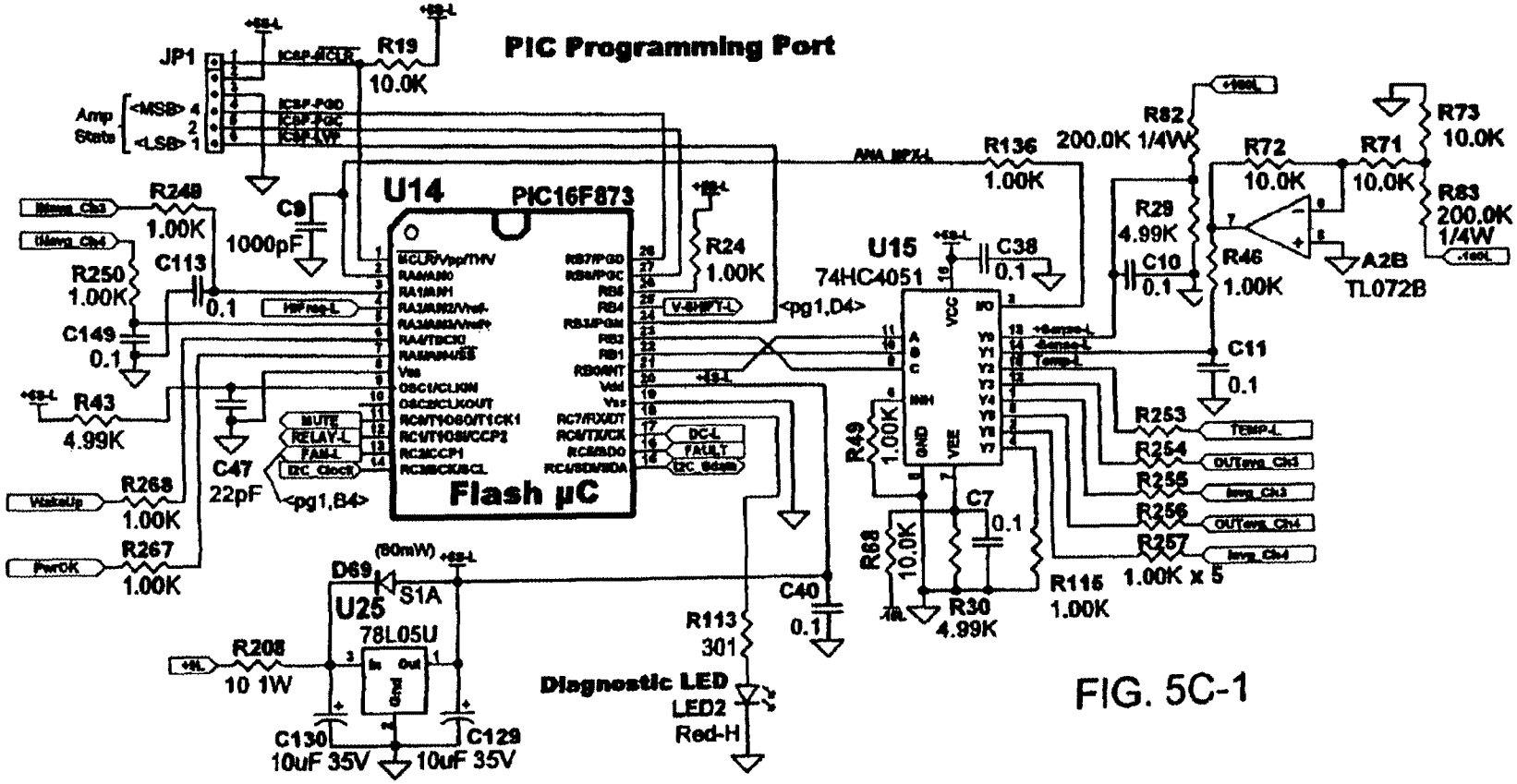
Figures 2, 5C:
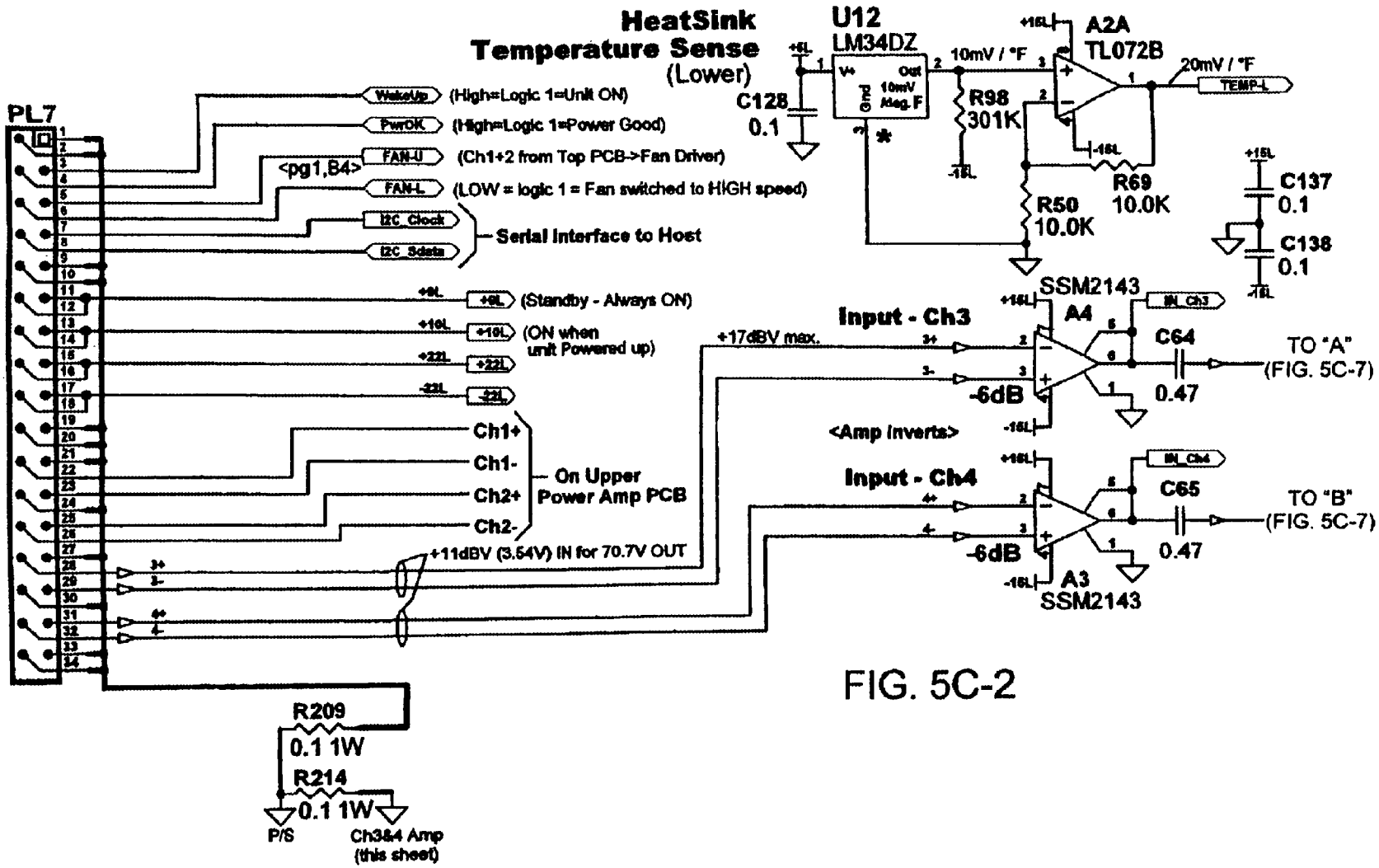
Figures 3, 5C:
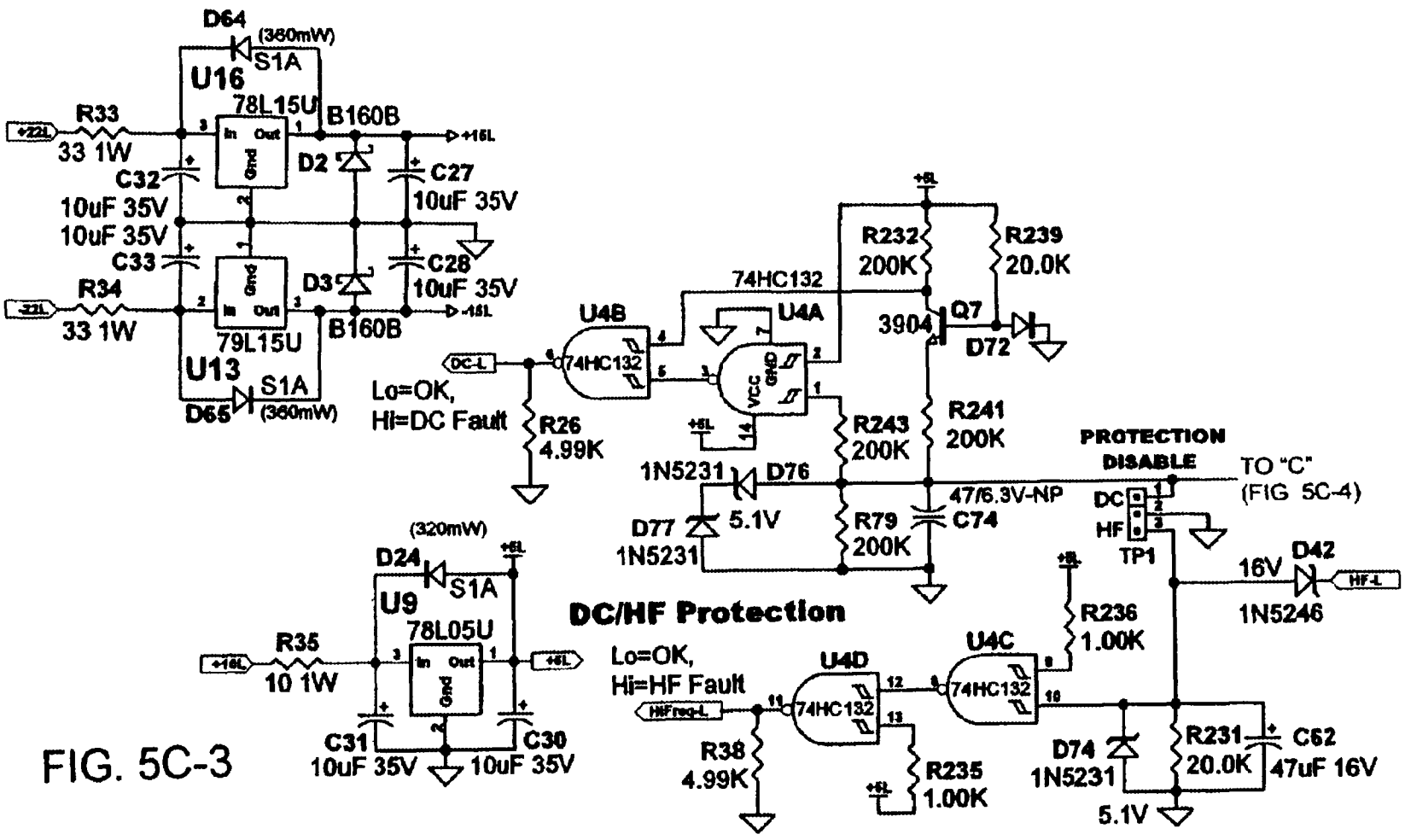
Figures 4, 5C:
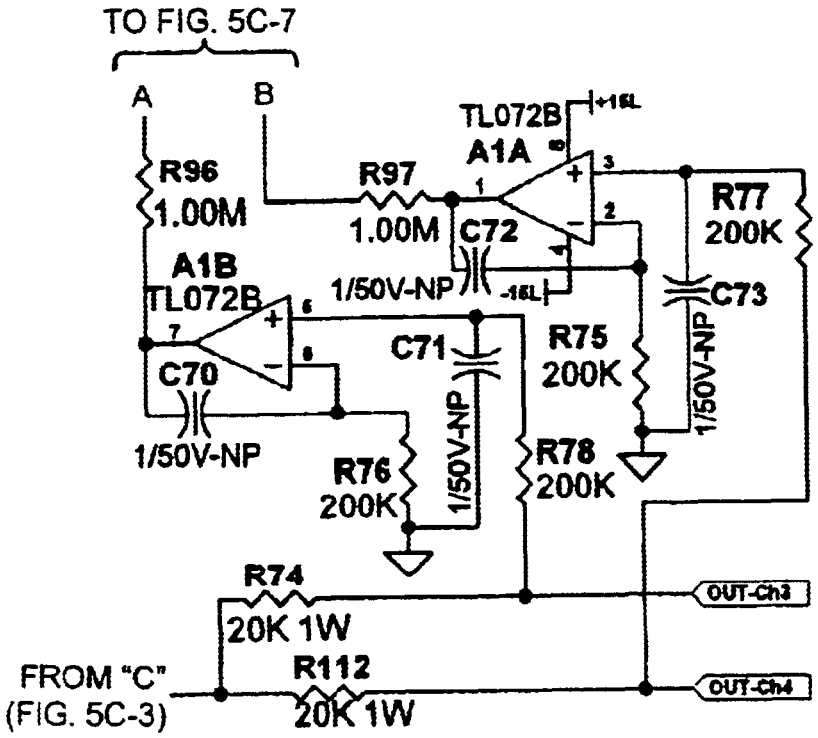
Figures 5, 5C:
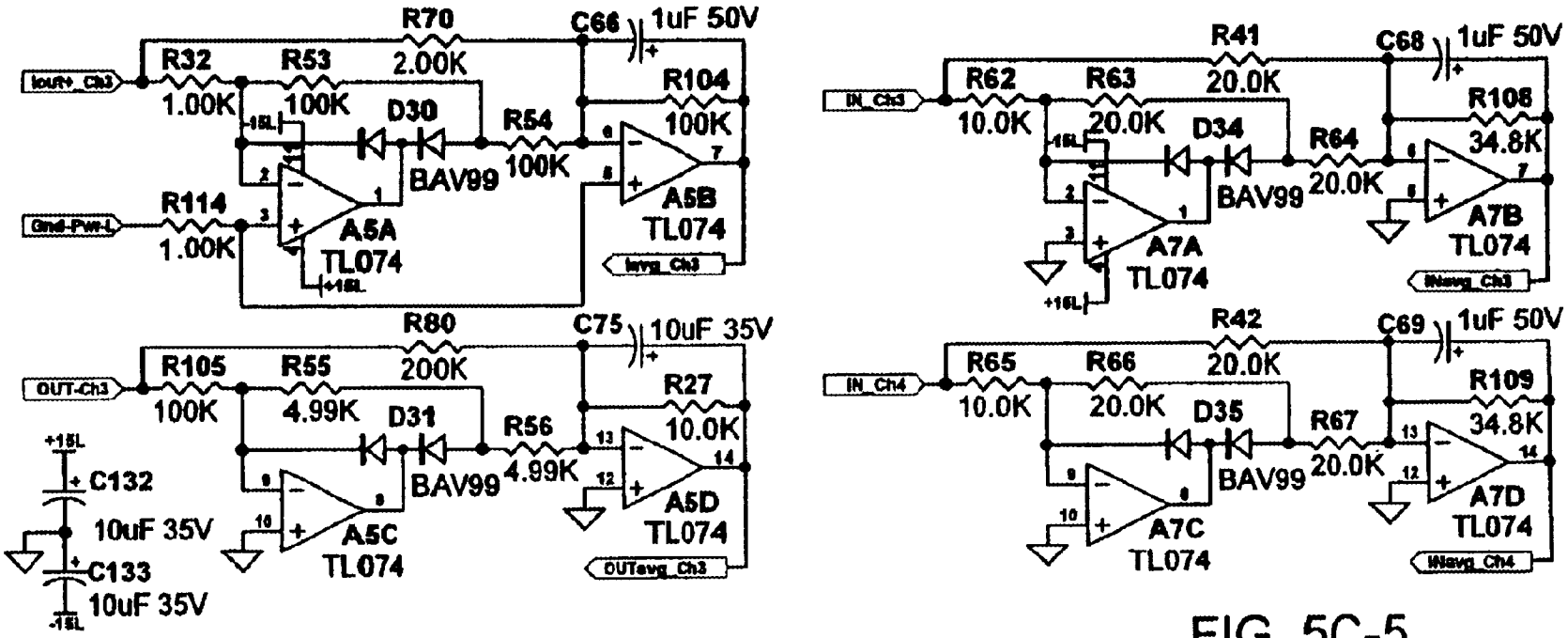
Figures 5, 5C, 6:
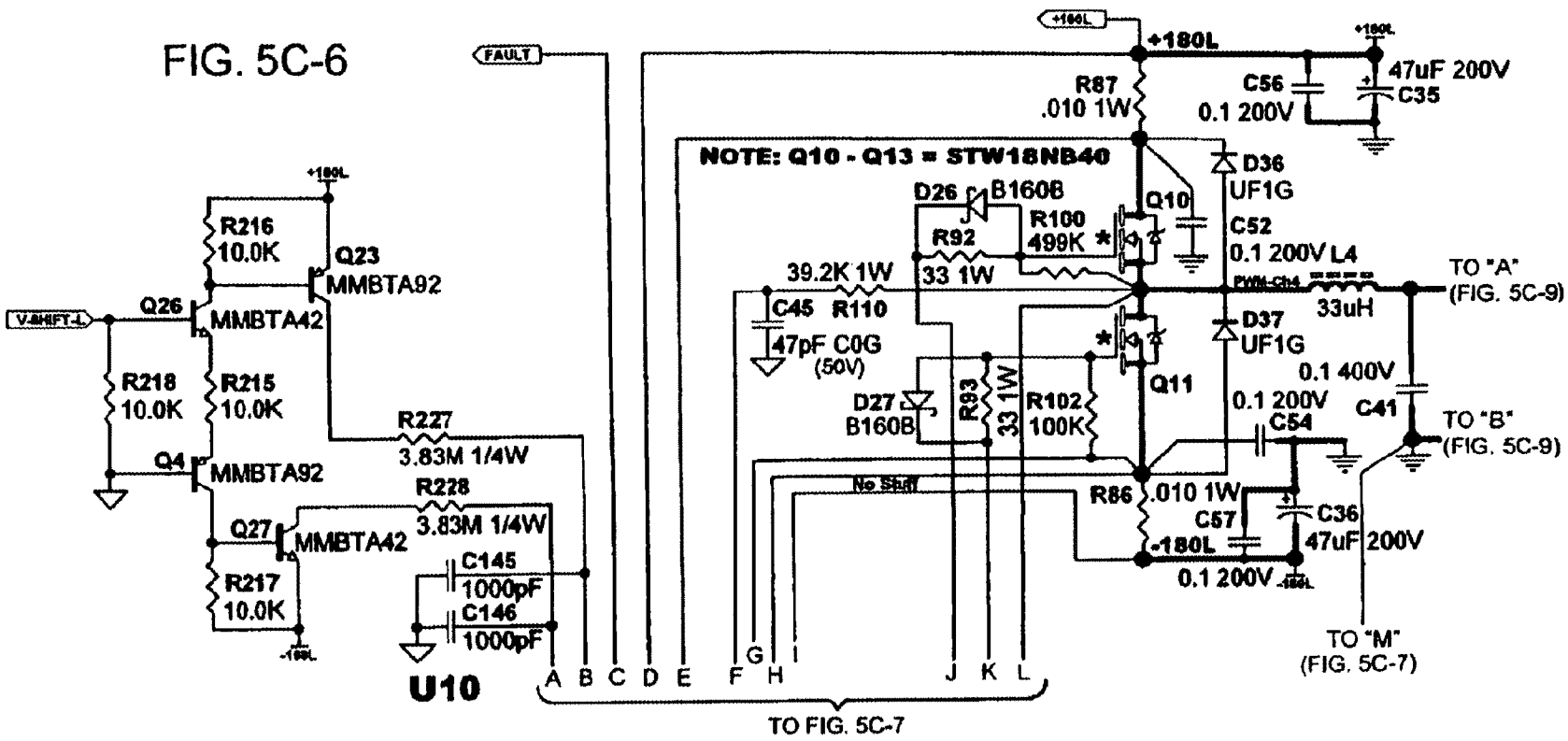
Figures 5, 5C, 6, 7:
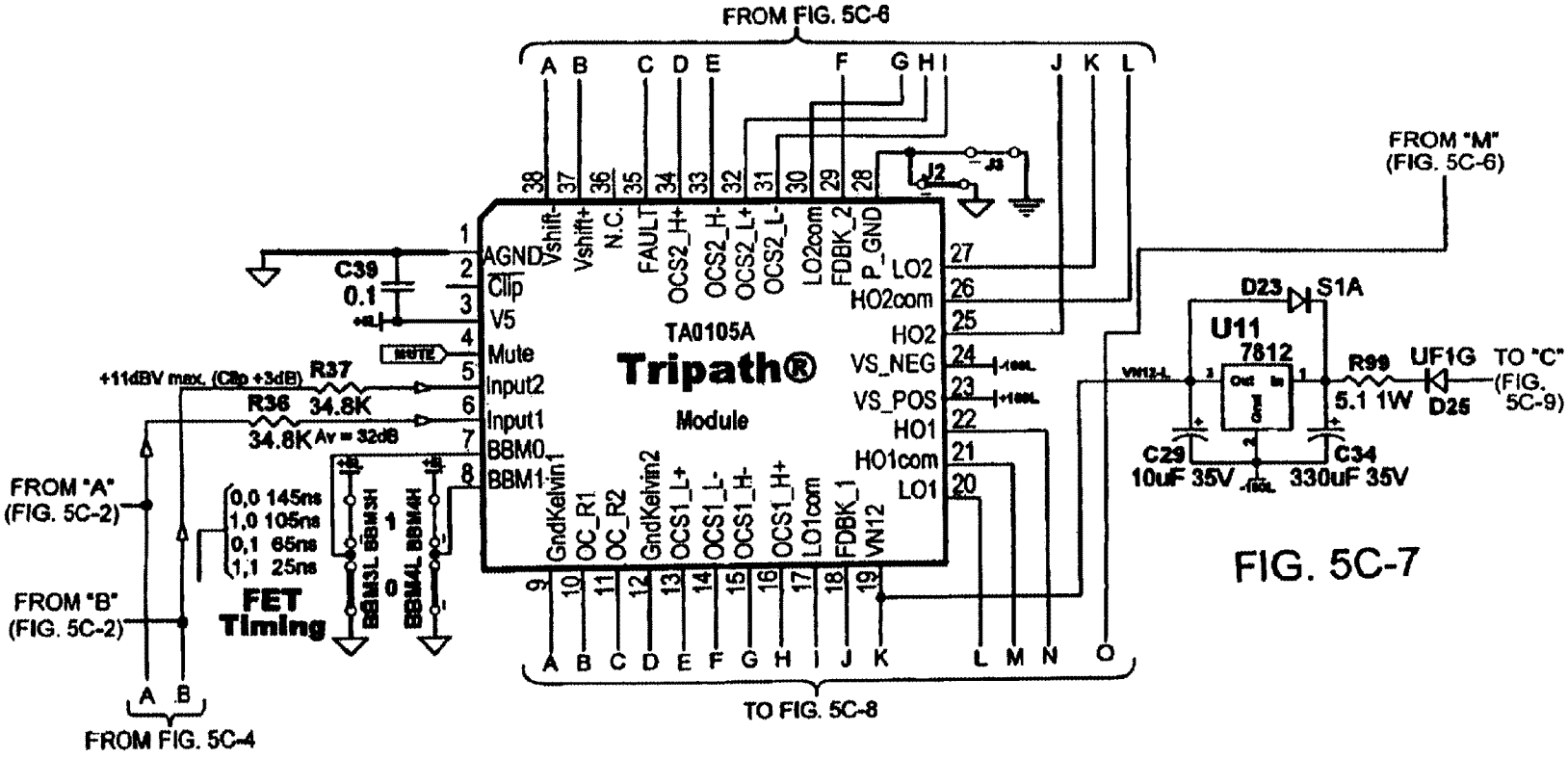
Figures 5, 5C, 6, 7, 8:
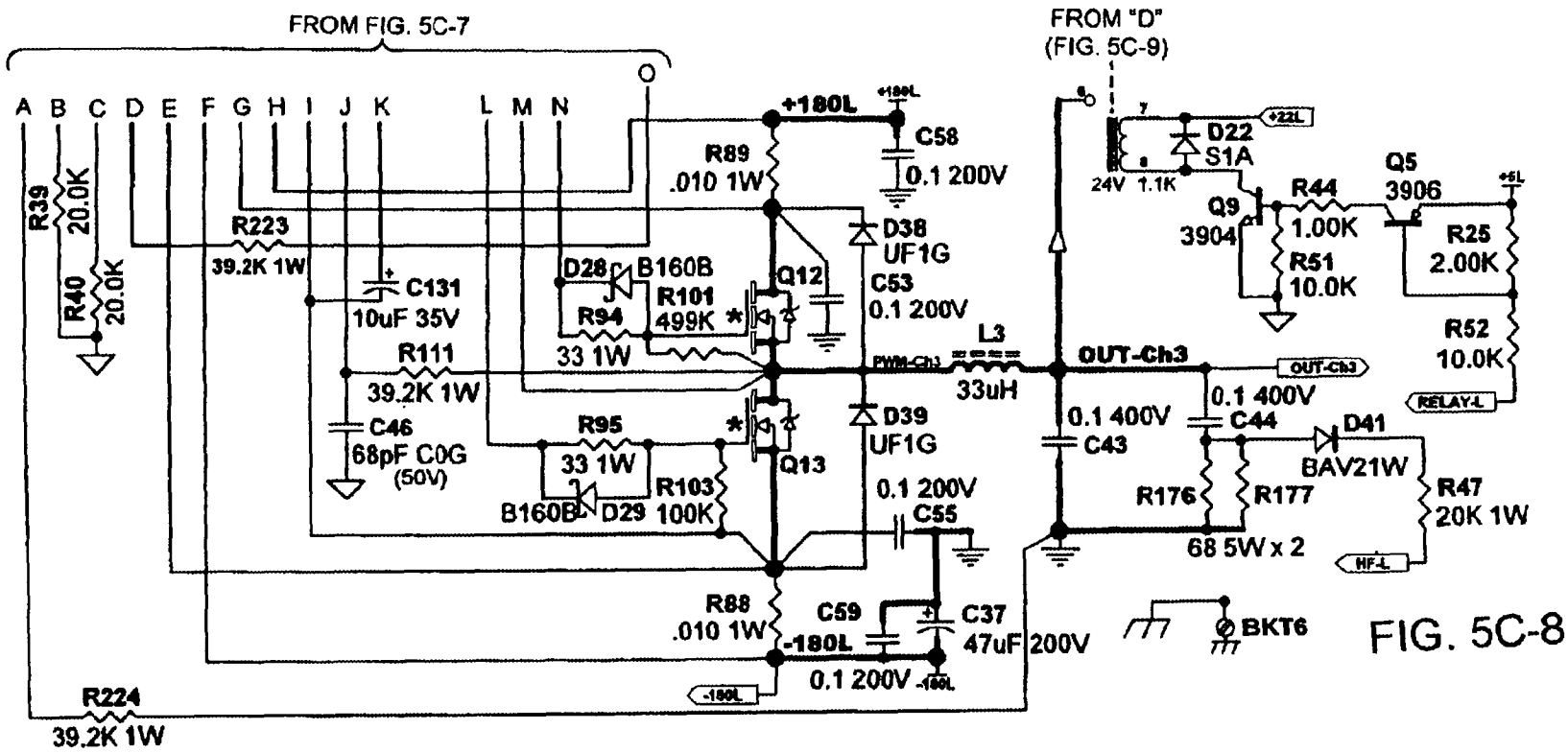
Figures 5, 5C, 6, 7, 8, 9:
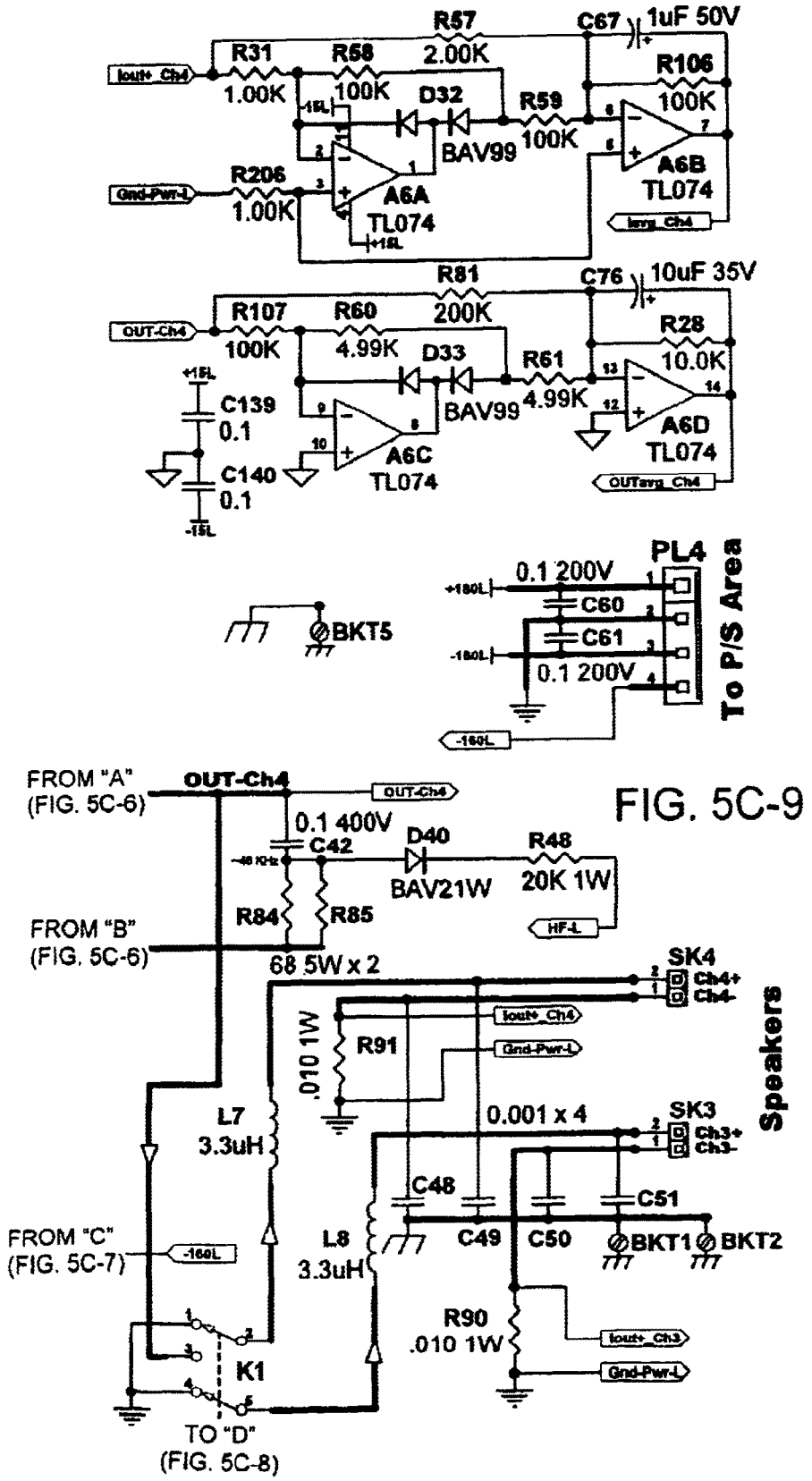
Figures 1, 5D:
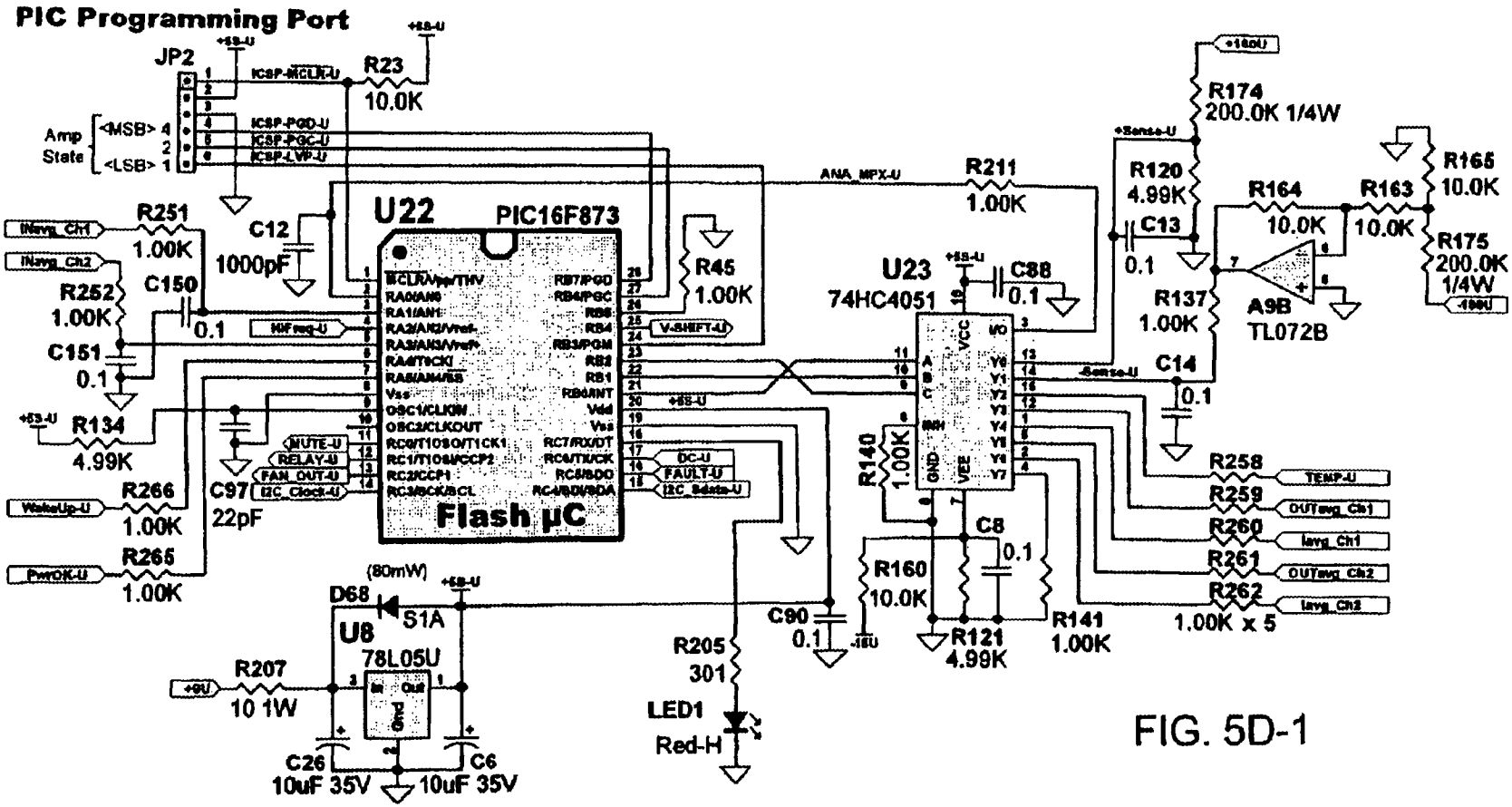
Figures 2, 5D:
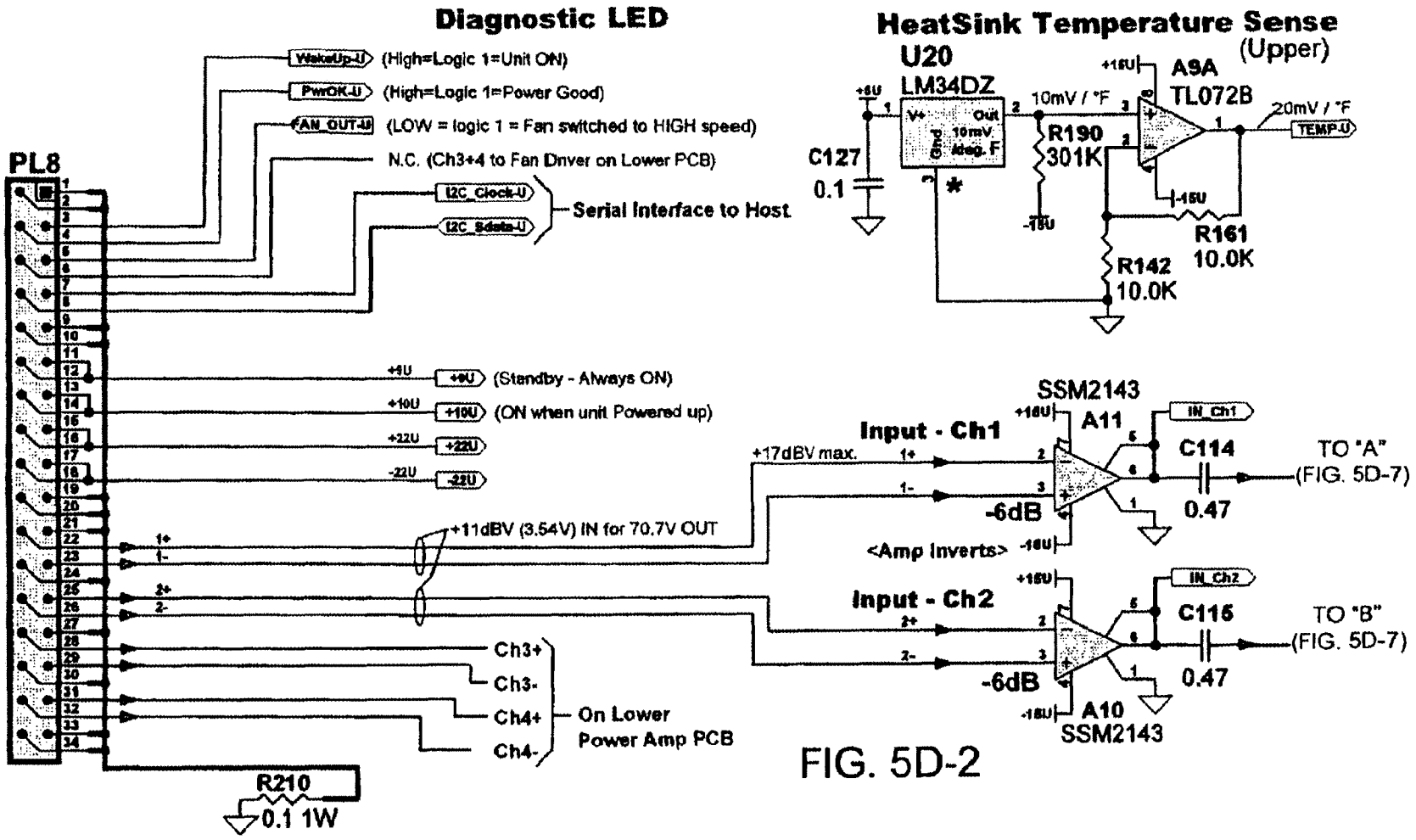
Figures 3, 5D:
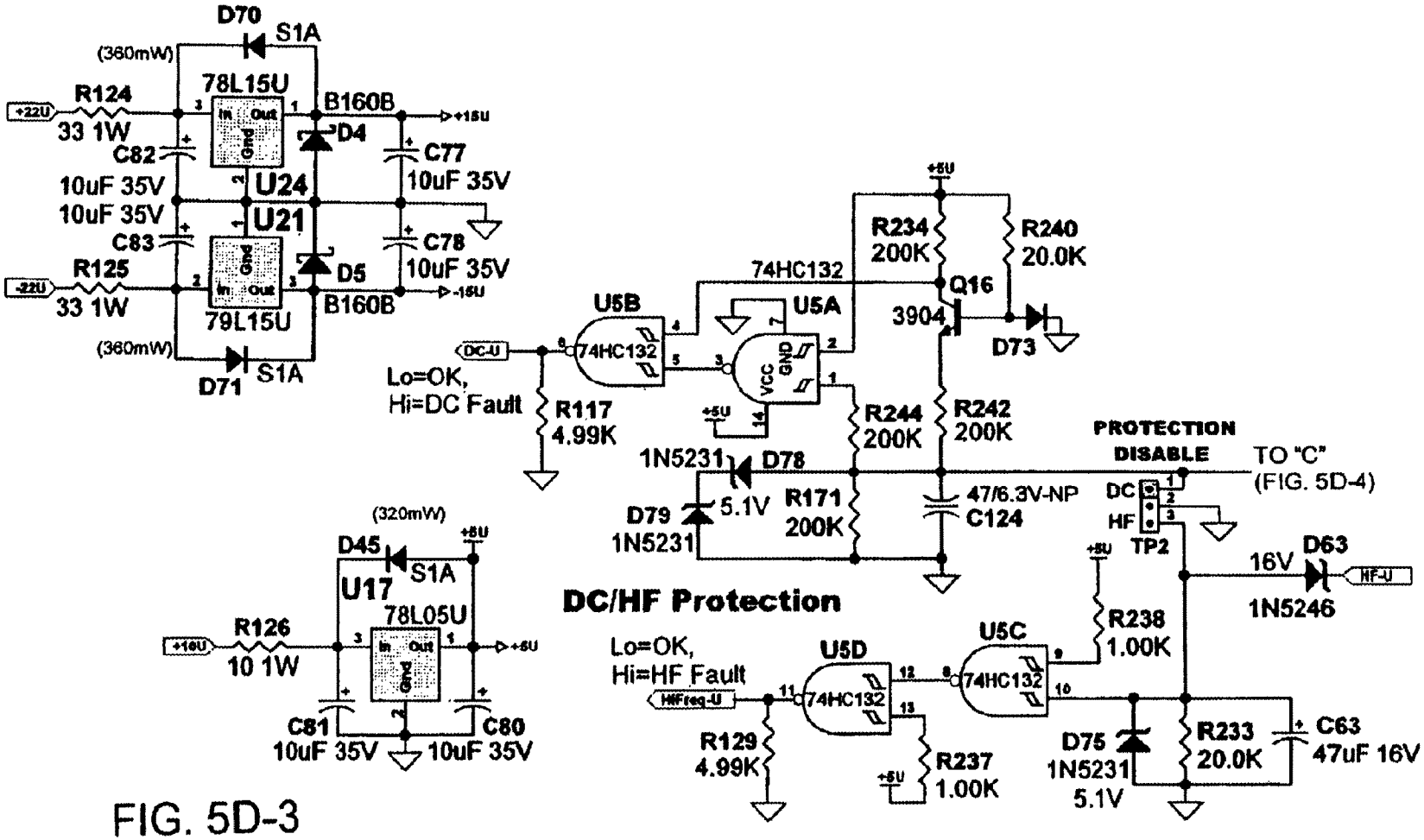
Figures 4, 5D:
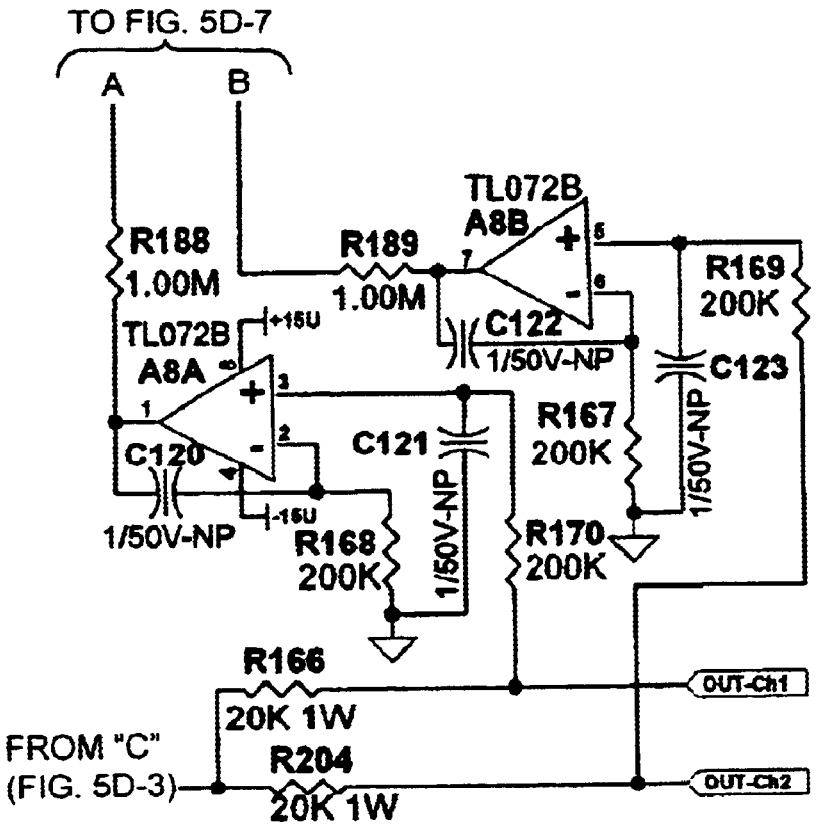
Figures 5, 5D:
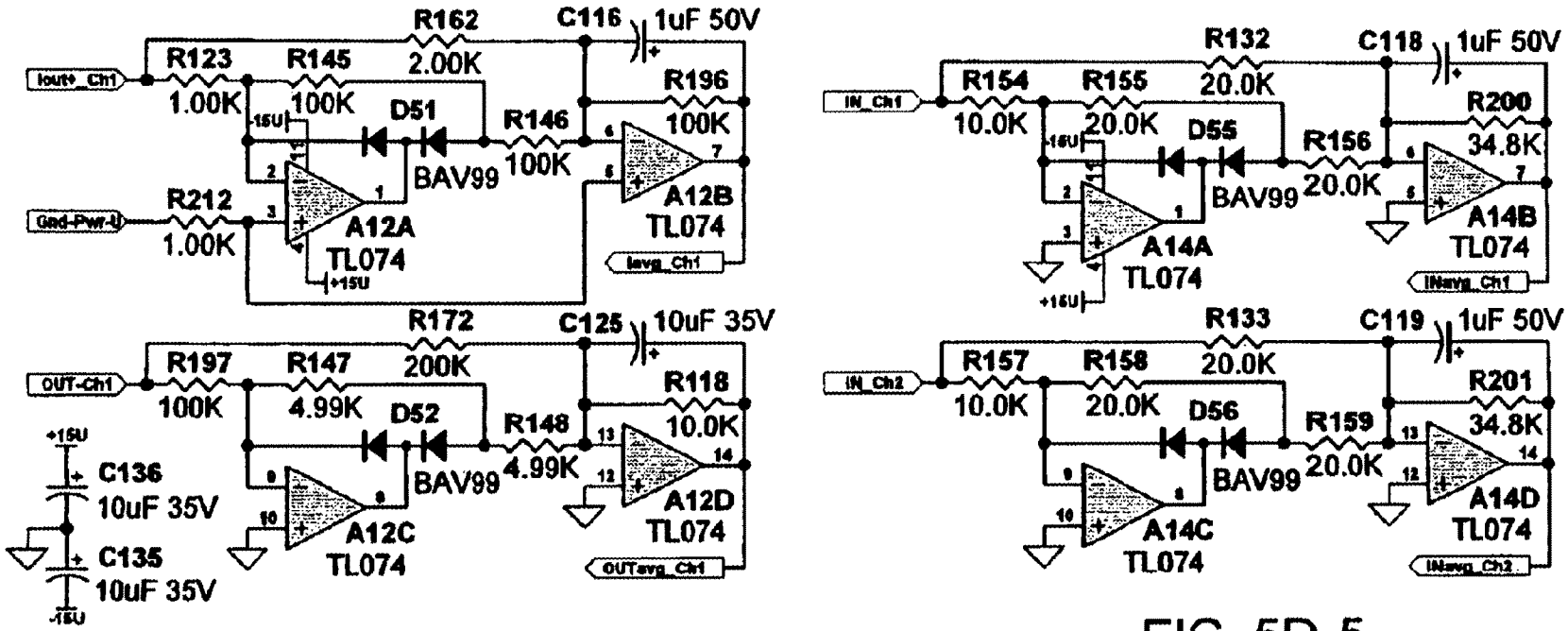
Figures 5, 5D, 6:
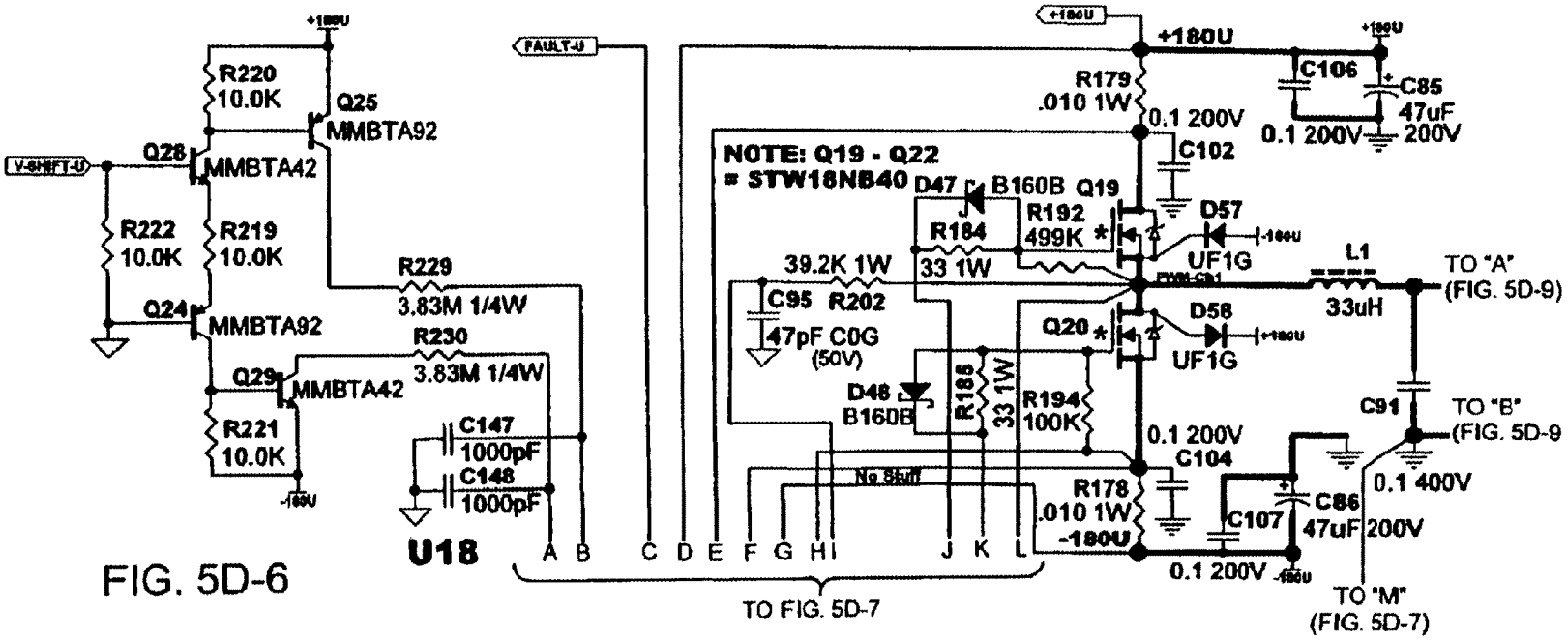
Figures 5, 5D, 6, 7:
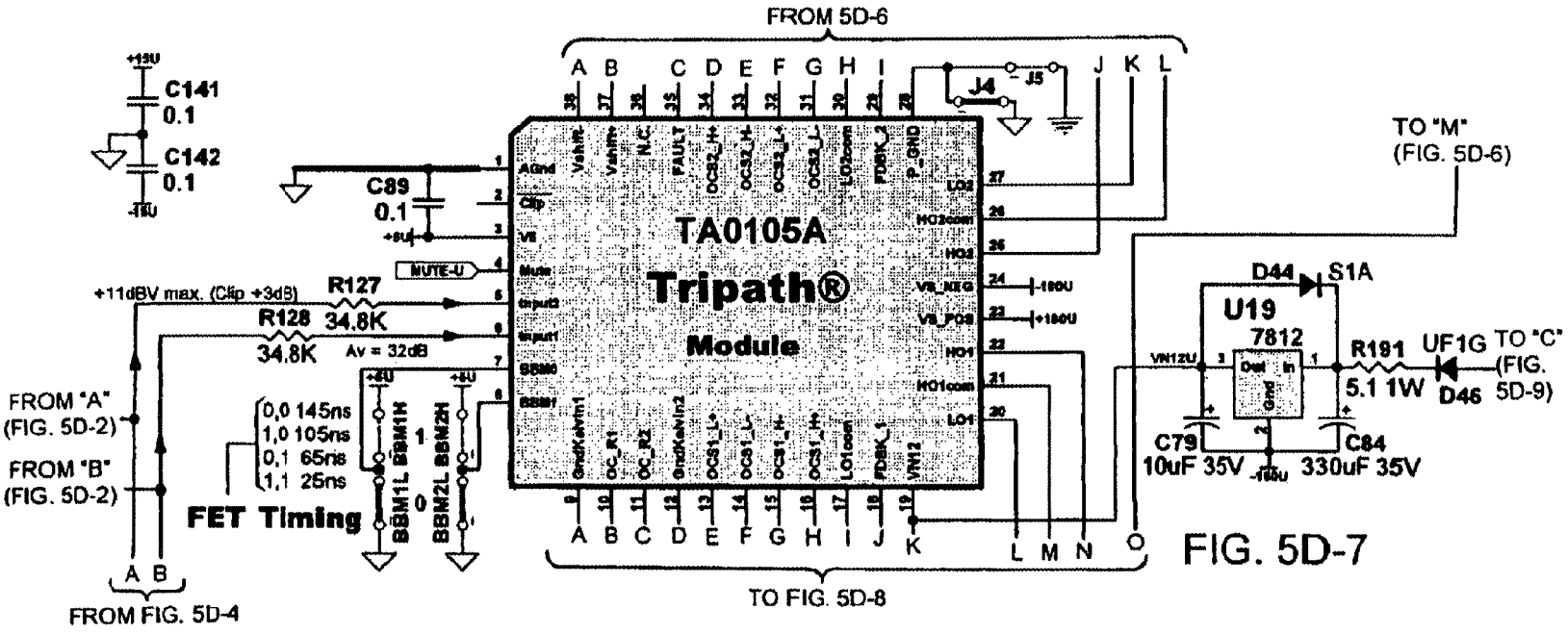
Figures 5, 5D, 6, 7, 8:
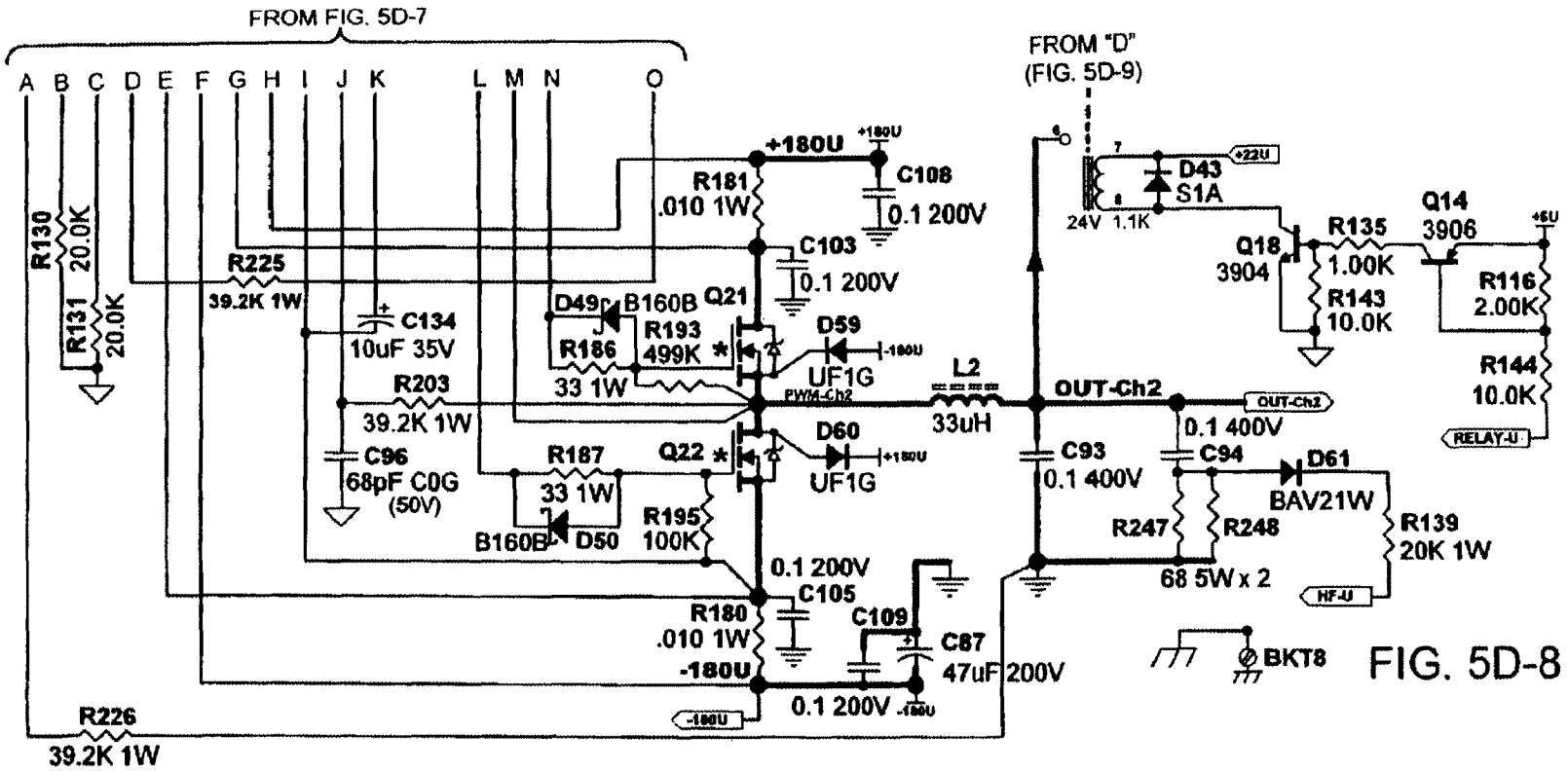
Figures 5, 5D, 6, 7, 8, 9:
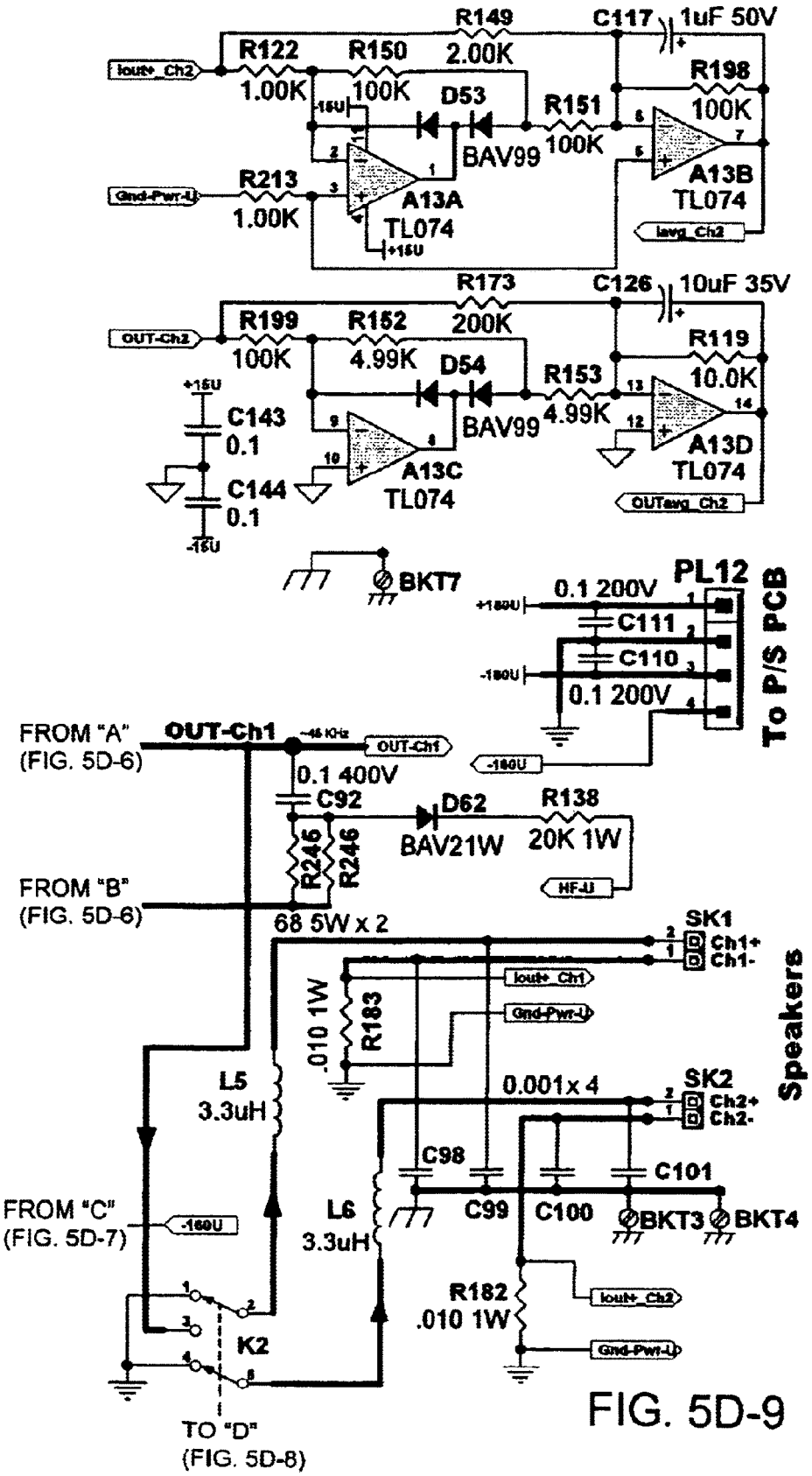

In one embodiment, the total power rating of the power amplifier system is 400 watts; that is, the power amplifier is constructed and arranged to have a power distribution capacity of 400 continuous average watts. The audio signal processor and router 18 may be a conventional analog or digital signal processor and router having multiple input and output channels, in this example four input and four output channels; the number of input channels does not have to be equal to the number of output channels. Power supply 13 is a conventional power converter, constructed and arranged to convert line AC voltage to ±130 or ±170 volts and to supply power equal to the total power rating of the power amplifier system, in this embodiment 400 watts (plus any power that is dissipated in the amplifiers). Power amplifiers 12-1-12-4 may be 70- or 100-volt high-voltage low-current power amplifiers, each rated at up to 400 watts. Power amplifiers 12-1-12-4 may be linear amplifiers, however in an exemplary embodiment, they are switching amplifiers, each containing two field effect transistors (FETs). Power amplifiers including switching amplifiers are advantageous over linear amplifiers in a system described by FIG. 1, because they are more efficient than linear amplifiers, particularly in the case of high power loads, and low power (or no) loads. Power amplifiers 12-1-12-4 are directly coupled to audio output lines 14-1-14-4; that is, there is no intervening transformer coupling power amplifiers 12-1-12-4 and audio output lines 14-1-14-4. Output lines 14-1-14-4 couple power amplifiers 12-1-12-4 to audio devices 16-1-16-4, respectively. Audio devices are shown as single transducers, however typically each power amplifier is coupled to a plurality of conventional loudspeakers constructed and arranged to operate at the output voltage of the power amplifiers. The power ratings of each of the individual power amplifiers 12-1-12-4 can be substantially greater (for example at least twice) the total power rating of the amplifier system 10 divided by the number of channels and up to a number equal to the total rating of the amplifier system. So, for example, in this embodiment, the power rating of the four channel power amplifier system 10 is 400 watts, the rating of each of the power amplifier channels is much greater than 100 watts, in this case 400 watts. Additional details of the power amplifiers 12-1-12-4 are shown in FIG. 4.

The common power supply is advantageous because separate power supplies for each channel would require a 400 watt power supply for each channel, even if some channels may be loaded at substantially less than 400 watts.

The power rating of each of the power amplifiers does not have to be equal to the power rating of the amplifier system as in the embodiment described in FIG. 1. Any significantly greater per channel power rating, such as two times the power rating of the amplifier system (in this case 400) divided by the number of power amplifier channels (in this case four) is advantageous. Nor is it necessary for all channels to have a significantly higher rating than the power rating of the amplifier system divided by the number of power amplifier channels. For example, in the embodiment of FIG. 1, it would still be advantageous if only one or two of the power amplifier channels of the embodiment of FIG. 1 were rated significantly higher than 100 watts. The principles of the invention are also applicable to multichannel power amplifier systems having more or fewer than four channels.

In a power amplifier system according to the invention, the total rated power distribution capacity can be apportioned to the individual channels in any desired combination. For example, the power amplifier system of FIG. 1 may be incorporated in a sound system for a restaurant. Coupled to power amplifier 12-1 by audio signal output line 14-1 may be ten loudspeakers tapped at 32 watts (320 watts) 16-1 which could be placed in the dining area of the restaurant. Coupled to power amplifier 12-2 by signal output line 14-2 may be a single loudspeaker tapped at 32 watts placed in a waiting area, for providing music, paging signals, and voice messages for waiting customers. Coupled to each of power amplifiers 12-3 and 12-4 by output lines 14-3 and 14-4 respectively, may be single loudspeakers 16-3 and 16-4 respectively tapped at eight watts (16 watts), which could be placed in the men's and ladies' restrooms. The example of FIG. 1 show that the wattage of the loudspeakers on each of the channels does not need to be "balanced" and that a large portion (320 watts or 87% in this example) of the total wattage (368 watts in this example) of the loudspeakers in the sound system may be driven by a single channel. The sound system of FIG. 1 could be easily converted to a sound system in which six loudspeakers tapped at 25 watts (150 watts each, total 300 watts) are coupled to each of power amplifiers 12-1 and 12-2, to provide different music to two dining areas of a restaurant, in which two loudspeakers tapped at 8 watts (16 watts) are coupled to power amplifier 12-3 to provide sound to the men's and ladies' rooms, and a single loudspeaker tapped at 32 watts could be placed in the waiting area.

In the discussion of FIG. 1, the wattages, voltages, methods of specifying amplifier power capacity and the specific usage are exemplary. The principles of the invention may be applied to other wattages, voltages, methods of specifying amplifier power capacity, and usages.

Figure 2:
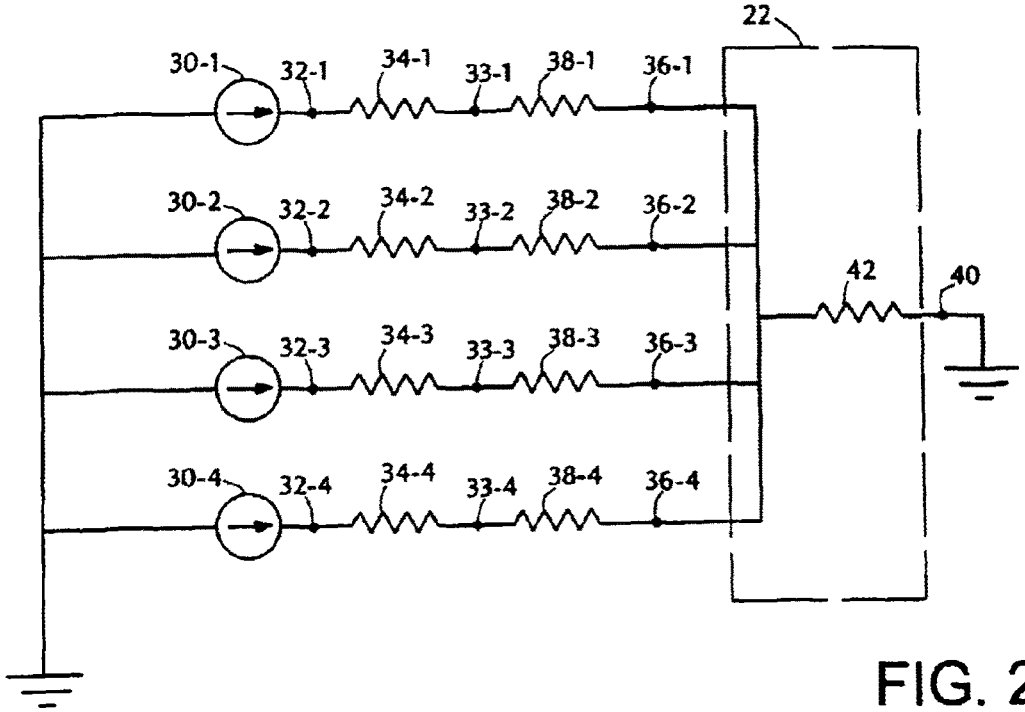
FIG. 2 is a thermal model of the amplifying system of FIG. 1.

Referring now to FIG. 2, there is shown a thermal model of a portion of the audio signal power amplifying system of FIG. 1. Power sources 30-1-30-4 represent the heat to be dissipated by each of the power amplifiers. Junction nodes 32-1-32-4 represent the junctions of the main output FETs in the power amplifiers 12-1-12-4, respectively. Case nodes 33-1-33-4 represent the cases of the respective FETs and are coupled to the junction nodes 32-1-32-4 through thermal resistors 34-1-34-4, respectively; thermal resistors 34-1-34-4 represent the thermal resistance between the junctions and the cases of the respective FETs. Sink nodes 36-1-36-4 are coupled to case nodes 34-1-34-4 through resistors 38-1-38-4, respectively. Resistors 38-1-38-4 represent the thermal resistance between the case and the heat sink. Sink nodes 36-1-36-4, represent the interface between the resistors 38-1-38-4 and the single heatsink 22. Sink nodes 36-1-36-4 are all connected to common heat sink node 39, which is coupled to thermal ground (ambient) node 40 through a single resistor 42, indicating that all four heat pairs of FETs are thermally coupled to a single heat sink and (as will be shown in FIG. 3) the thermal resistances of the single heat sink for the four pairs of FETs are substantially similar. The heat sink dissipates all the heat produced by the FETs that is not dissipated by the resistors (34-1-34-4 and 38-1-38-4) that are associated with the individual FETs. A typical thermal resistance value for resistors 34-1-34-4 is 0.7° C./watt, and is determined by the characteristics of the chip embodying the FET and its package. A typical thermal resistance value for resistors 38-1-38-4 is 0.3° C./watt and is determined by the elements between the chip package and the heat sink, such as thermal washers and insulators, thermal grease, and the like. A typical thermal resistance for resistor 42 in a 400 watt power amplifier system is 2.0° C./watt, which represents the heatsink to ambient thermal resistance.

Figure 3:
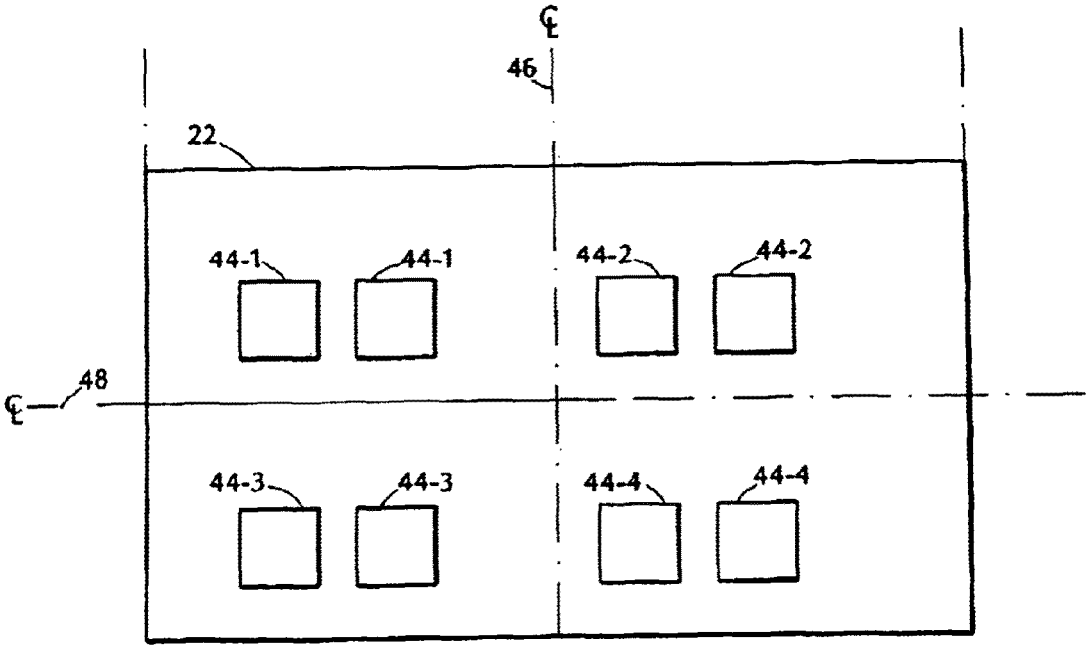
FIG. 3 is a top plan view of a heat sink for the amplifying system of FIG. 1, showing the footprints of heat producing elements of the amplifying system of FIG. 1.
Figure 4A:
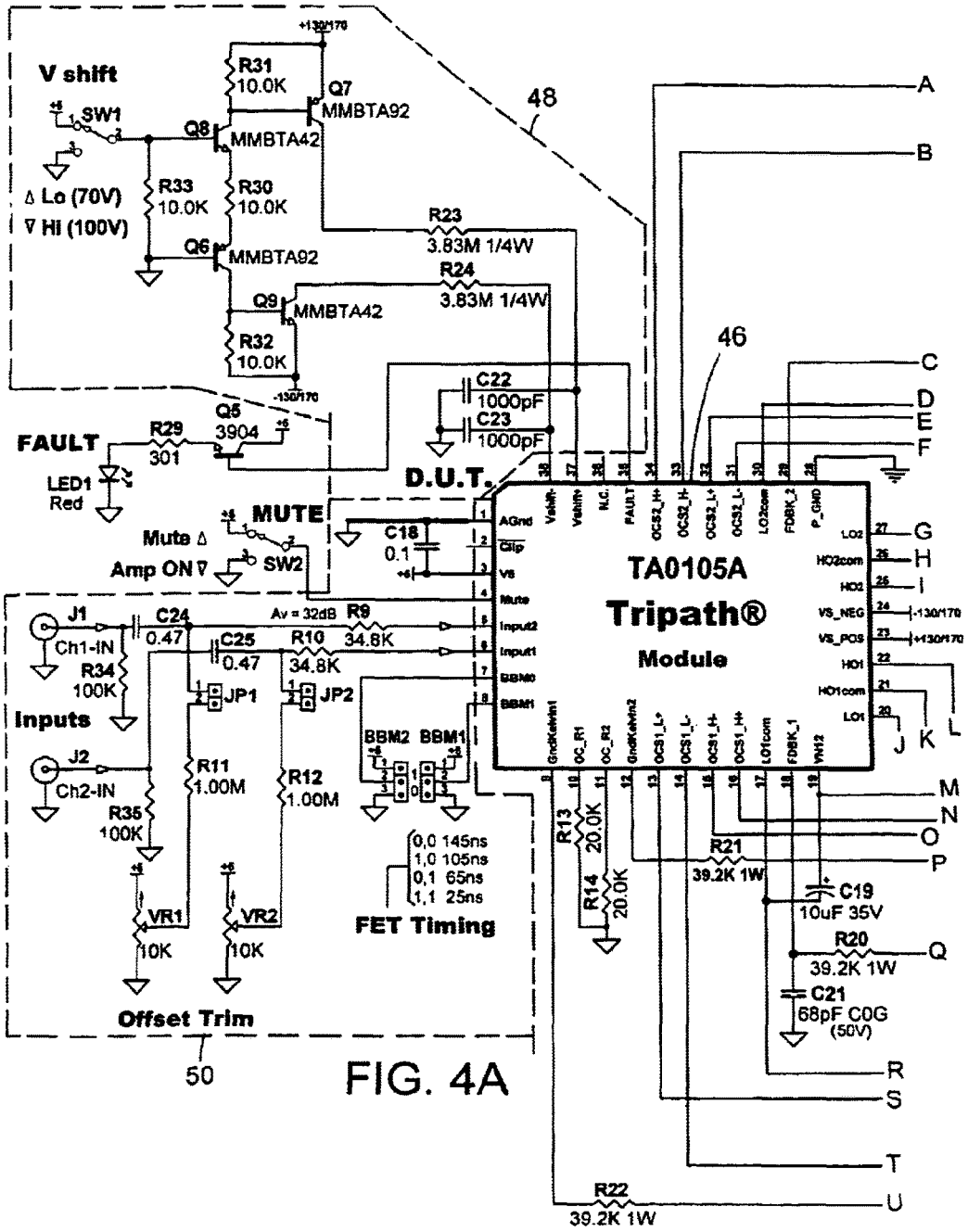
FIG. 4 is a simplified schematic diagram of a circuit for implementing the power distribution portion of the amplifying system of FIG. 1.
Figure 4B:
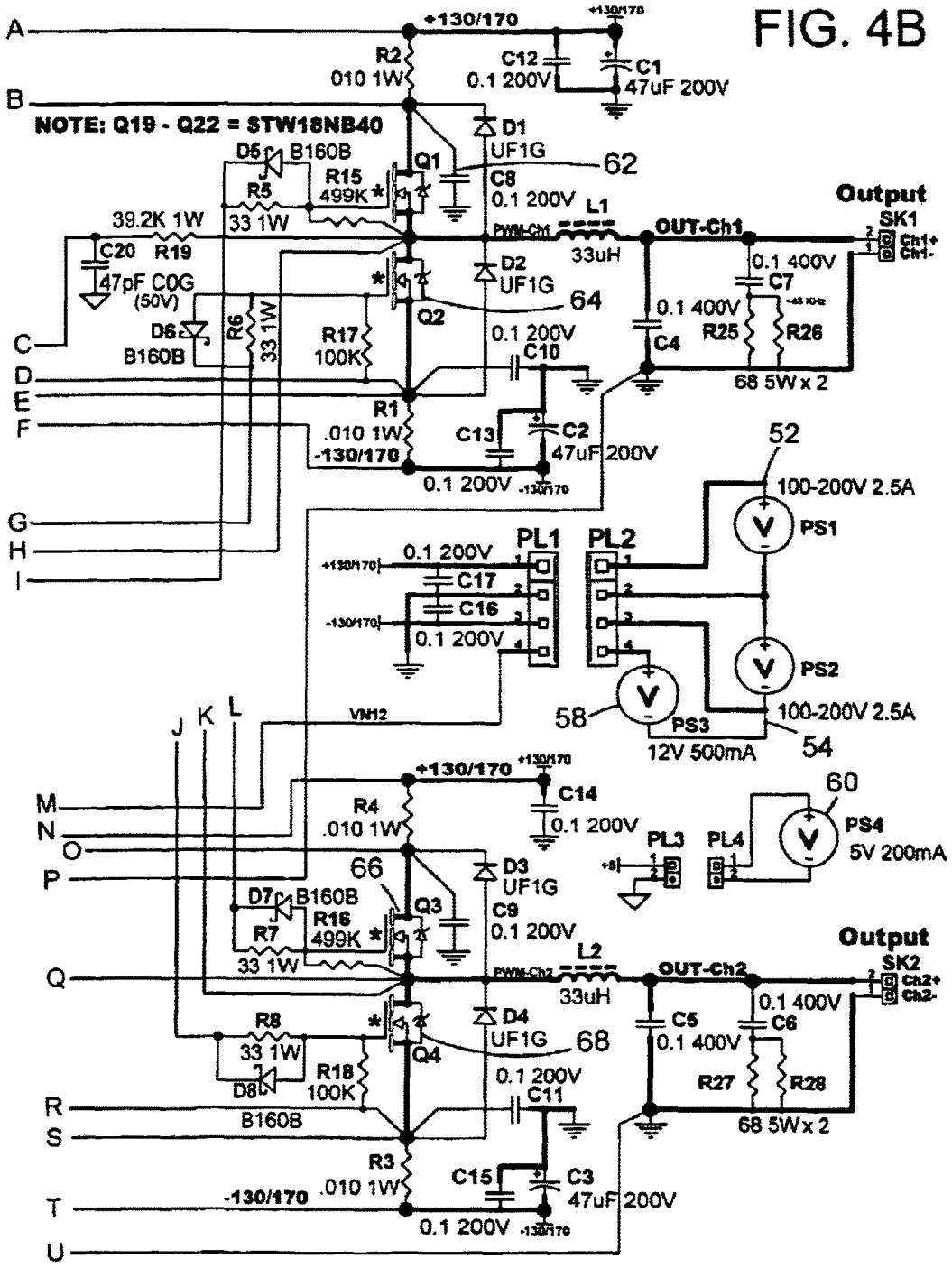

Referring to FIG. 3, there is shown a physical implementation of portions of the audio power supply of FIG. 1 that are represented by elements of the thermal model of FIG. 2. FET footprints 44-1-44-4 are the footprints on heatsink 22 of the pair of FETs associated with power amplifiers 12-1-12-4, respectively. FET footprints 44-1-44-4 correspond to the interface represented by sink nodes 36-1-36-4 of FIG. 3. FET footprints 41-1-44-4 have a similar orientation relative to heatsink 22 and to each other. If heatsink 22 is substantially rectangular and center lines 46 and 48 are drawn perpendicular to the sides, each of the footprints 44-1-44-4 are in a different quadrants. No three of the footprints are collinear, so that the thermal path between any of the footprints 44-1-44-4 and any point of heatsink 22 passes at most through one other footprint. The thermal path between each of the footprints and the two closest edges of the rectangular heat sink passes through none of the other footprints. Mounting the pairs of FETs on a common heatsink, and in a substantially symmetrical pattern (that is, the footprint of each pair of FETs has the same orientation relative to the other pairs of FETs and to the boundaries of the plane of the heat sink on which they are mounted), with no three pairs of FETs mounted collinearly is advantageous because it enables adequate heat dissipation with a minimum of heat sink material. Since each of the channels is capable of a 400 watt capacity, each pair of FETs may dissipate heat resulting from the transmission of 400 watts.

Referring to FIG. 4, there is shown a schematic diagram of a simplified circuit for implementing and testing two output channels of the amplifier system of FIG. 1. Implementing a four channel output could be done by a second essentially identical circuit. Module 46 is a model TA0105A module available commercially from Tripath, Inc. of Santa Clara, Calif. (www.tripath.com). The circuitry in sector 48 optimizes the protection circuits of module 46 for 70 Volt or 100 Volt operation. The circuitry in sector 50 is for inputting signals into module 46 and to control the DC offset at the output. The remainder of the circuit of FIG. 4 implements two of the channels of the power amplifier system. Power input terminals 52 and 54 represent the inputs from power supply 13 of FIG. 1 to two of the power amplifiers such as 14-1 and 14-2 of FIG. 1. 12 volt power supply 58 and five volt power supply 60 (neither shown in FIG. 1) supply power for some of the devices of the circuit. FETs 62, 64, 66, and 68 represent the FETs referenced previously in the discussion of FIGS. 1, 2, and 3.

Referring to FIGS. 5a-5d there is shown a schematic diagram of a circuit implementing the power amplifying system of FIG. 1.

It is evident that those skilled in the art may now make numerous uses of and departures from the specific apparatus and techniques disclosed herein without departing from the inventive concepts. Consequently, the invention is to be construed as embracing each and every novel feature and novel combination of features disclosed herein and limited only by the spirit and scope of the appended claims.

What is claimed is:

[1. A multichannel electrical power amplifying system constructed and arranged to distribute electrical power of amount P to a total electrical load coupled thereto, said system comprising:

a plurality n of power amplifier channels, coupling said power amplifying system to a portion of said electrical load, each of said amplifier channels for distributing a portion of said electrical power P to a corresponding portion of said total electrical load, each power amplifier channel having a power distribution capacity, wherein at least one of said power amplifier channels is constructed and arranged to have a power distribution capacity significantly greater than $$\frac{P}{n}$$

and wherein the sum of the capacities of the plurality of amplifier channels is significantly greater than P.]

[2. A multichannel electrical power amplifying system in accordance with claim 1, wherein said at least one of said power amplifier channels is constructed and arranged to have a power distribution capacity substantially equal to P.]

[3. A multichannel electrical power amplifying system in accordance with claim 1, wherein more than one of said power amplifier channels are constructed and arranged to have a power distribution capacity significantly greater than $$\frac{P}{n}.$$

]

[4. A multichannel electrical power amplifying system in accordance with claim 3, wherein said more than one of said power amplifier channels comprise switching amplifiers.]

[5. A multichannel electrical power amplifying system in accordance with claim 3, wherein said more than one of said power amplifier channels are constructed and arranged to have a power distribution capacity substantially equal to P.]

[6. A multichannel electrical power amplifying system in accordance with claim 3, wherein all of said power amplifier channels are constructed and arranged to have a power distribution capacity significantly greater than $$\frac{P}{n}.$$

]

[7. A multichannel electrical power amplifying system in accordance with claim 6, wherein said all of said power amplifier channels comprise a switching amplifier.]

[8. A multichannel electrical power amplifying system constructed and arranged to distribute electrical power of amount P to a total electrical load coupled thereto, said system comprising:

a plurality n of power amplifier channels, coupling said power amplifying system to a portion of said electrical load, each of said amplifier channels for distributing a portion of said electrical power P to a corresponding portion of said total electrical load, each power amplifier channel having a power distribution capacity, wherein at least one of said power amplifier channels is constructed and arranged to have a power distribution capacity significantly greater than $$\frac{P}{n}$$

and wherein the sum of the capacities of the plurality of amplifier channels is significantly greater than P, wherein more than one of said power amplifier channels are constructed and arranged to have a power distribution capacity significantly greater than $$\frac{P}{n}.$$

wherein all of said power amplifier channels are constructed and arranged to have a power distribution capacity significantly greater than $$\frac{P}{n}.$$

wherein n is greater than two, and wherein said power amplifier channels comprise heat producing elements, said multichannel electrical power amplifying system further comprising a heat sink having at least one substantially planar surface, mounting points on said planar surface for said heat producing elements, wherein said mounting points for said n power amplifying channels are noncollinear.]

[9. A multichannel electrical power amplifying system in accordance with claim 6, further comprising a single power supply, coupled to all of said amplifier channels, for supplying electrical power to all of said channels.]

[10. A multichannel electrical power amplifying system in accordance with claim 3, wherein all of said power amplifier channels are constructed and arranged to have a power distribution capacity substantially equal to P.]

[11. A multichannel electrical power amplifying system in accordance with claim 1, wherein said at least one of said power amplifier channels comprises a switching amplifier.]

[12. A multichannel electrical power amplifying system in accordance with claim 1, wherein the sum of the capacities of the plurality of amplifier channels is nP.]

[13. A multichannel electrical power amplifying system in accordance with claim 1, further comprising a power supply for converting line current to direct current, said power supply constructed and arranged to supply power substantially equal to P.]

[14. A multichannel electrical power amplifying system constructed and arranged to provide a total amount of electrical power P, comprising;

a plurality of electrically powered devices, said devices representing an electrical load;

a number n of power amplifier channels, each amplifier channel coupled to a portion of said electrical load, each of said plurality of power amplifier channels for providing a portion of said total amount of electrical power P to said portion of said electrical load, wherein one of said portions significantly exceeds $$\frac{P}{n};$$

a plurality of input channels for receiving a plurality of input signals; and circuitry to selectively route said input signal from any of said plurality of input channels to any one of said power amplifier channels.]

[15. A multichannel electrical power amplifying system in accordance with claim 14, wherein the electrical power received by said one channel load is substantially equal to P.]

[16. A multichannel electrical power amplifying system in accordance with claim 14, wherein the power provided by more than one of said channels significantly exceeds $$\frac{P}{n}.$$

]

[17. A multichannel electrical power amplifying system in accordance with claim 16, wherein said more than one of said power amplifier channels comprise switching amplifiers.]

[18. A multichannel electrical power amplifying system in accordance with claim 14, wherein at least one of said power amplifier channels comprises a switching amplifier.]

[19. A multi-channel electrical power amplifying system constructed and arranged to distribute electrical power of amount P to a total electrical load coupled thereto, said system comprising:

a plurality n>2 of power amplifier channels, coupling said power amplifying system to a portion of said electrical load, each of said amplifier channels for distributing a portion of said electrical power P to a corresponding portion of said total electrical load, each power amplifier channel having a power distribution capacity, said power amplifier channels comprising heat producing elements; and a heat sink for conducting heat away from said heat producing elements having at least one substantially planar surface and mounting points on said planar surface for said heat producing elements, wherein said mounting points for said n power amplifying channels are noncollinear.]

[20. A multi-channel electrical power amplifying system in accordance with claim 19, wherein at least one of said power amplifier channels is constructed and arranged to have a power distribution capacity significantly greater than $$\frac{P}{n}$$

and wherein the sum of the capacities of the plurality of amplifier channels is significantly greater than P.]

[21. A multi-channel electrical power amplifying system in accordance with claim 20, wherein said at least one power amplifier channels is constructed and arranged to have a power distribution capacity substantially equal to P.]

[22. A multi-channel electrical power amplifying system in accordance with claim 20, wherein more than one of said power amplifier channels are constructed and arranged to have a power distribution capacity significantly greater than $$\frac{P}{n}.$$

]

[23. A multi-channel electrical power amplifying system in accordance with claim 22, wherein all of said power amplifier channels are constructed and arranged to have a power distribution capacity substantially equal to P.]

[24. A multi-channel electrical power amplifying system in accordance with claim 20, wherein the sum of the capacities of the plurality of amplifier channels is nP.]

*25. A multichannel electrical power amplifying system constructed and arranged to distribute a total electrical power of amount P to a total electrical load coupled thereto, said system comprising:*

*a plurality n of power amplifier channels, coupling said multichannel electrical power amplifying system to a portion of said electrical load, each of said plurality n of power amplifier channels for distributing a portion of said total electrical power P to a corresponding portion of said total electrical load, each power amplifier channel having a power distribution capacity, wherein each of said power amplifier channels is constructed and arranged to have a power distribution capacity substantially equal to P and wherein the sum of the capacities of the plurality n of power amplifier channels is significantly greater than P,*

*a power supply for converting line current to direct current, said power supply being (a) electrically connected to the amplifier channels, and (b) constructed and arranged to supply power substantially equal to P to the power amplifier channels,*

*wherein as each of the power amplifier channels has a power distribution capacity substantially equal to P, said total electrical power P can be apportioned to the plurality n of power amplifier channels in any desired combination.*

*26. A multichannel electrical power amplifying system in accordance with claim 25, wherein said at least one of said plurality n of power amplifier channels is constructed and arranged to have a power distribution capacity substantially equal to P.*

*27. A multichannel electrical power amplifying system in accordance with claim 25, wherein more than one of said plurality n of power amplifier channels are constructed and arranged to have a power distribution capacity significantly greater than P/n.*

*28. A multichannel electrical power amplifying system in accordance with claim 27, wherein said more than one of said plurality n of power amplifier channels comprise switching amplifiers.*

*29. A multichannel electrical power amplifying system in accordance with claim 27, wherein said more than one of said plurality n of power amplifier channels are constructed and arranged to have a power distribution capacity substantially equal to P.*

*30. A multichannel electrical power amplifying system in accordance with claim 27, wherein all of said plurality n of power amplifier channels are constructed and arranged to have a power distribution capacity significantly greater than P/n.*

*31. A multichannel electrical power amplifying system in accordance with claim 30, wherein all of said plurality n of power amplifier channels comprise a switching amplifier.*

*32. A multichannel electrical power amplifying system in accordance with claim 30, wherein n is greater than two, and wherein said plurality n of power amplifier channels comprise heat producing elements, said multichannel electrical power amplifying system further comprising a heat sink having at least one substantially planar surface, mounting points on said planar surface for said heat producing elements, wherein said mounting points for said n power amplifying channels are noncollinear.*

*33. A multichannel electrical power amplifying system in accordance with claim 27, wherein all of said plurality n of power amplifier channels are constructed and arranged to have a power distribution capacity substantially equal to P.*

*34. A multichannel electrical power amplifying system in accordance with claim 25, wherein said at least one of said plurality n of power amplifier channels comprises a switching amplifier.*

*35. A multichannel electrical power amplifying system in accordance with claim 25, wherein the sum of the capacities of the plurality n of power amplifier channels is nP.*

* * * * *